US006930941B2

United States Patent
Nakase

(10) Patent No.: US 6,930,941 B2
(45) Date of Patent: Aug. 16, 2005

(54) SEMICONDUCTOR MEMORY DEVICE HAVING POTENTIAL AMPLITUDE OF GLOBAL BIT LINE PAIR RESTRICTED TO PARTIAL SWING

(75) Inventor: Yasunobu Nakase, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/677,012

(22) Filed: Oct. 2, 2003

(65) Prior Publication Data

US 2004/0130926 A1 Jul. 8, 2004

(30) Foreign Application Priority Data

Jan. 8, 2003 (JP) ..................................... 2003-002366

(51) Int. Cl.[7] .............................................. G11C 7/00
(52) U.S. Cl. .................. 365/205; 365/154; 365/189.05
(58) Field of Search ................................ 365/205, 154, 365/189.05

(56) References Cited

U.S. PATENT DOCUMENTS

| 4,975,877 | A | * | 12/1990 | Bell | ...................... 365/189.01 |
| 5,539,691 | A | * | 7/1996 | Kozaru et al. | ......... 365/189.05 |
| 5,659,513 | A | * | 8/1997 | Hirose et al. | ................ 365/205 |
| 5,724,292 | A | * | 3/1998 | Wada | .......................... 365/207 |
| 6,088,276 | A | | 7/2000 | Ukita | |
| 2004/0022109 | A1 | * | 2/2004 | Yoon et al. | .................. 365/205 |

FOREIGN PATENT DOCUMENTS

| JP | 2-246093 | 10/1990 |
| JP | 7-161192 | 6/1995 |
| JP | 11-306762 | 11/1999 |

OTHER PUBLICATIONS

"A Scalable Performance 32b Microprocessor", Lawrence T. Clark, et al., 2001 IEEE International Solid–State Circuits Conference, Feb. 6, 2001, pp. 230–231.

* cited by examiner

*Primary Examiner*—Hoai Ho
(74) *Attorney, Agent, or Firm*—McDermott Will & Emery LLP

(57) ABSTRACT

A local sense amplifier drives a global bit line pair by potentials of data storage nodes when a global word line attains an H level. A global sense amplifier amplifies the potential difference of data storage nodes when a global sense enable signal attains an H level. The global sense enable signal is inverted by an inverter to be provided to a global word driver. When the global word line attains an L level by the global word driver, the local sense amplifier suppresses the drive of the global bit line pair.

9 Claims, 18 Drawing Sheets

SEMICONDUCTOR MEMORY DEVICE HAVING POTENTIAL AMPLITUDE OF GLOBAL BIT LINE PAIR RESTRICTED TO PARTIAL SWING

BACKGROUND OF THE INVENTION

1. Field of the Invention

The present invention relates to a semiconductor memory device, particularly to the technique of lowering power consumption in a static random access memory (SRAM).

2. Description of the Background Art

In accordance with the reduction in power consumption of electrical equipment in these years, there have been intensive efforts to reduce power consumption of semiconductor memory devices employed in such electronic equipment.

As one method of partially achieving low power consumption of semiconductor memory devices, Japanese Patent Laying-Open No. 7-161192 discloses the provision of a first transfer gate between a bit line pair and a sense amplifier to prevent full swing of the potential of the bit line pair isolated from the first transfer gate.

In an SRAM having the memory cell array divided into a plurality of blocks, the global bit line connecting respective blocks of memory cells still attains a full swing even though the potential amplitude of the bit line is restricted to a partial swing as described above. Power consumption is particularly noticeable when there are many output terminals.

SUMMARY OF THE INVENTION

An object of the present invention is to provide a semiconductor memory device having the potential amplitude of a global bit line pair restricted to a partial swing.

According to an aspect of the present invention, a semiconductor memory device includes a sense amplifier group configured in hierarchy to read out data from a memory cell, a complementary signal line group connecting a sense amplifier of a lower hierarchy level and a sense amplifier of a higher hierarchy level, and a control circuit suppressing the drive of complementary signal lines by the sense amplifier of the lower hierarchy level connected to the complementary signal lines, and rendering active the sense amplifier of the upper hierarchy level connected to the complementary signal lines, before the potential difference between the complementary signal lines arrives at the level of the power supply voltage.

According to the semiconductor memory device of the present invention, the potential amplitude can be restricted to a partial swing in a global bit line pair, in addition to a local bit line pair and a local data line pair.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

The first embodiment of the present invention is directed to a semiconductor memory device having the potential amplitude restricted to a partial swing in a global bit line pair.

Entire Structure

Figure 1:
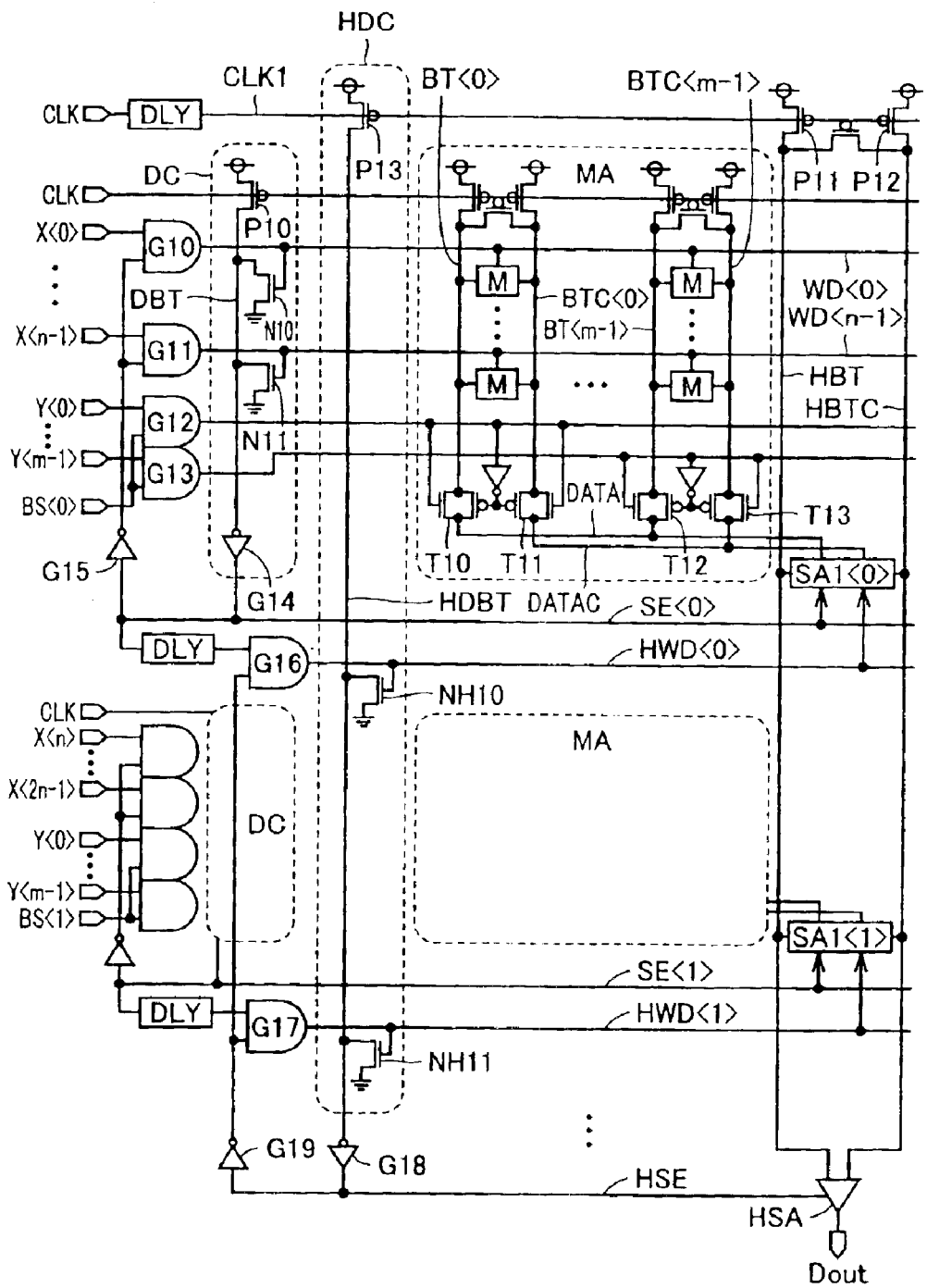
FIG. 1 shows a structure of a main part of an SRAM according to a first embodiment of the present invention.

Referring to FIG. 1, an SRAM according to the first embodiment of the present invention has a memory cell array MA divided into a plurality of blocks in the bit line direction. By dividing the memory cell array MA, the number of memory cells M connected to a selected bit line pair can be reduced to lower the parasitic capacitance of the bit line pair, leading to lower power consumption.

Each block is supplied with n row address signal, respectively differing for each block. Specifically, the row address signals X<0> to X<n−1> are applied to the 0th block. Row address signals X<n> to X<2n−1> are applied to the first block. In FIG. 1, the circuit configuration of the 0th block is depicted. The remaining blocks have a similar circuit configuration.

Word line drivers G10 and G11 drive word lines WD<0> and WD<n−1>, respectively. A word line driver is provided corresponding to each word lines. In FIG. 1, only word line drivers G10 and G11 are depicted representative thereof.

Each word line has m memory cells M connected.

In each block, m local bit line pairs BT<0>, BTC<0>, ... BT<m−1>, BTC<m−1> are provided. Each memory cell M is connected to an appropriate one of the bit line pairs.

Column addresses Y<0> to Y<m−1> are applied common to each block. One bit line pair is selected in response to any one of the column addresses being set at an H level (logical high). The selected bit line pair is connected to a pair of local data lines DATA and DATAC via transmission gates T10–T13.

A dummy column DC generates a local sense enable signal SE<0> that is an activation signal of a local sense amplifier SA1<0>.

A global dummy column HDC controls the activation of global word lines HWD<0>, HWD<1> . . . , and generates a global sense enable signal HSE controlling activation of a global sense amplifier HSA.

Structure of Local Sense Amplifier SA1

Figure 2:
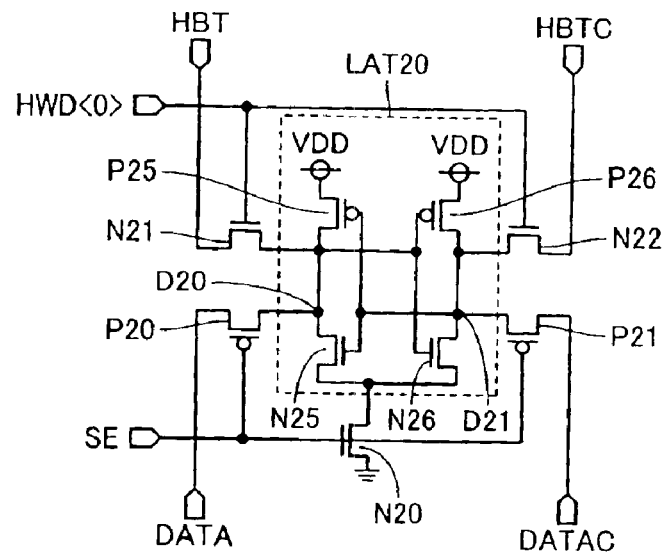
FIG. 2 shows a structure of a local sense amplifier SA1 of the first embodiment.

FIG. 2 shows a structure of a local sense amplifier SA1<0> of the first embodiment. Local sense amplifier SA1<0> is a local sense amplifier provided corresponding to the 0th block. All the local sense amplifiers SA1<0>, SA1<1> . . . are indicated generically as local sense amplifier SA1. Similarly, all the local bit line pairs and global word lines are indicated generically as local bit line pair BT, BTC, and global word line HWD, respectively.

Local sense amplifier SA1<0> has its input terminal connected to local data line pair DATA, DATAC, and its output terminal connected to global bit line pair HBT, HBTC.

When local sense enable signal SE<0> is at an L level (logical low), P channel MOS transistors P20 and P21 conduct. In response, the potential of local data line DATA is set at a data storage node D20 whereas the potential of local data line DATAC is set at a data storage node D21.

When local sense enable signal SE<0> attains an H level, N channel MOS transistor N20 conducts. In response, amplification is conducted so that the potentials of data storage nodes D20 and D21 are set so that one attains the level of VDD and the other attains the level of GND.

When global word line HWD<0> attains an H level, N channel MOS transistors N21 and N22 conduct. In response, the potential of data storage node D20 is driven to global bit line HBT whereas the potential of data storage node D21 is driven to global bit line HBTC. Accordingly, local sense amplifier SA1<0> operates as a sense amplifier to amplify the potential difference of local data line pair DATA, DATAC, and also outputs a potential corresponding to stored data to global bit line pair HBT, HBTC, corresponding to the operation of a memory cell.

When global word line HWD<0> attains an L level, N channel MOS transistors N21 and N22 are rendered non-conductive. In response, the drive of global bit line HBT by the potential of data storage node D20 as well as the drive of global bit line HBTC by the potential of data storage node D21 is suppressed.

Structure of Global Sense Amplifier HSA

Figure 3:
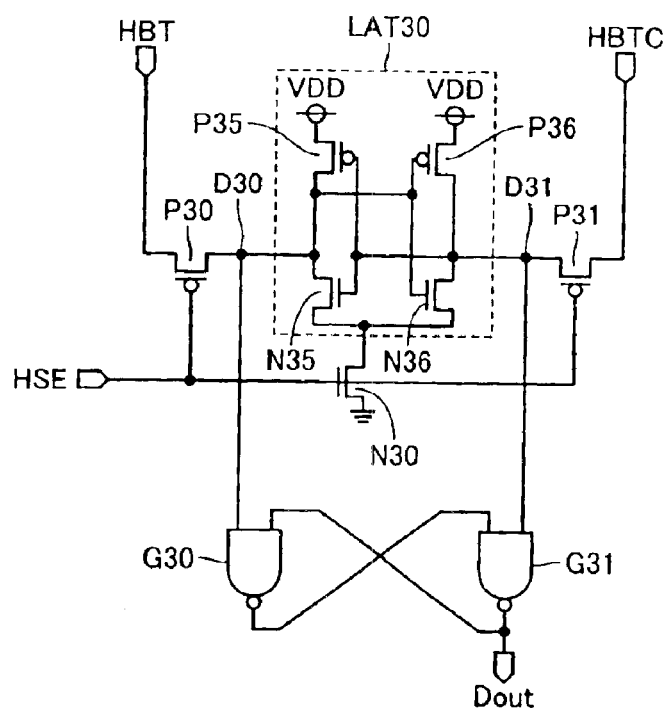
FIG. 3 shows a structure of a global sense amplifier HSA of the first embodiment.

FIG. 3 shows a structure of a global sense amplifier HSA of the first embodiment. Following the generation of sufficient potential difference between global bit lines HBT and HBTC, global sense enable signal HSE output from global dummy column HDC attains an H level. In response, N channel MOS transistor N30 is rendered conductive, whereas P channel MOS transistors P30 and P31 are rendered non-conductive. The potential of one of data storage nodes D30 and D31 attains the level of VDD whereas the other attains the level of GND.

In response to the next rise of clock CLK, global sense enable signal HSE attains an L level. The potentials of data storage nodes D30 and D31 are retained at a latch circuit formed of two NAND gates G30 and G31.

Read Out Operation

A data read out operation will be described with reference to the timing chart of FIG. 4.

During the period of time where clock CLK is at an L level, and a clock CLK1 that is a delayed version of clock CLK by a predetermined time through a delay circuit DLY is at an L level, a precharged operation set forth below is carried out.

All local bit line pairs BT, BTC are set at an H level when clock CLK is at an L level.

In dummy column DC, P channel MOS transistor P10 is rendered conductive when clock CLK is at an L level. In response, dummy bit line DBT is set at an H level. This H level of dummy bit line DBT is inverted by an inverter G14. Local sense enable signal SE<0> is set at an L level.

In global dummy column HDC, P channel MOS transistor P13 is rendered conductive when clock CLK1 is at an L level. In response, global dummy bit line HDBT is set at an H level. This H level of global dummy bit line HDBT is inverted by an inverter G18. Global sense enable signal HSE is set at an L level.

When clock CLK1 is at an L level, P channel MOS transistors P11 and P12 conduct. Accordingly, global bit line pair HBT, HBTC is set at an H level.

In local sense amplifier SA1<0>, P channel MOS transistors P20 and P21 are rendered conductive whereas N channel MOS transistor N20 is rendered non-conductive when local sense enable signal SE<0> is at an L level. In response, the potential on local data line DATA is applied to data storage node D20 of a latch & amplify circuit LAT20, whereas the potential of local data line DATAC is supplied to data storage node D21 of latch & amplify circuit LAT20.

In global sense amplifier HSA, P channel MOS transistors P30 and P31 are rendered conductive whereas N channel MOS transistor N30 is rendered non-conductive when global sense enable signal HSE is at an L level. In response to the conduction of P channel MOS transistors P30 and P31, the potentials of global bit line pair HBT, HBTC are transferred to data storage nodes D30 and D31, respectively.

Then, a read out operation is initiated when clock CLK is pulled up to an H level at time t0.

Figure 4:
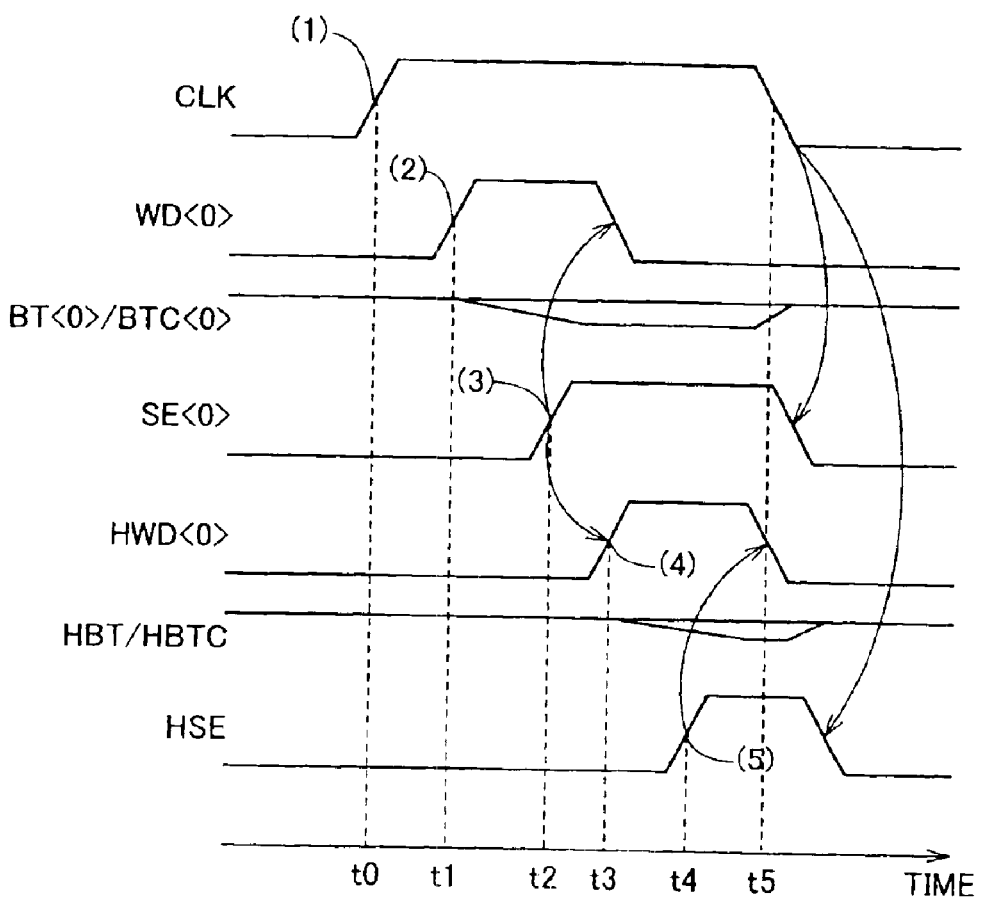
FIG. 4 is a timing chart to describe a data readout operation of the SRAM of the first embodiment.

Specifically, in synchronization with the rise of clock CLK (FIG. 4, (1)), the external address is rendered valid. At the elapse of a period of time required for address decoding, one memory cell M is selected through all the blocks. In the following, description is based on the case where a memory cell M is selected, specified by a row address signal X<0> and a column address signal Y<0> of the 0th block.

When row address X<0> attains an H level, word line WD<0> is pulled up to an H level at time t1 by word line driver G10 (FIG. 4, (2)). In response, data of all memory cells M connected to word line WD<0> are output to respective-connected bit line pairs. Accordingly, the potential of one bit line of the bit line pair connected to each memory cell becomes lower than the level of VDD.

Then, a block select signal BS<0> and the column select signal attain an H level. Therefore, the potentials of local bit line pair BT<0> and BTC<0> are transferred to local data line pair DATA and DATAC.

In dummy column DC, N channel MOS transistor N10 is rendered conductive in response to word line WD<0> pulled up to an H level, whereby dummy bit line DBT is set at an L level. The driving capability of N channel MOS transistor N10 is larger than the driving capability of the N channel MOS transistor in the memory cell. Therefore, the rate of the potential drop of dummy bit line DBT is faster than the rate of the potential drop of local bit line BT or BTC.

Inverter G14 inverts the L potential level of dummy bit line DBT. At time T2 local sense enable signal SE<0> is set at an H level (FIG. 4 (3)).

N channel MOS transistor N10 (and N11) is sized so that local sense enable signal SE<0> is rendered active to an H level when the potential difference ΔV between local data lines DATA and DATAC, i.e., the input signal to local sense amplifier SE<0>, becomes large enough (generally, 200 mV–300 mV).

This local sense enable signal SE<0> is inverted by an inverter G15 to be provided to word drivers G10 and G11. In response, all word lines attain a non-selected state, whereby the potential reduction of the bit line is ceased. In other words, no current flows from memory cell M.

In local sense amplifier SA1<0>, P channel MOS transistors P20 and P21 are rendered non-conductive whereas N channel MOS transistor N20 is rendered conductive when local sense enable signal SE<0> attains an H level. In response, the potential difference between data storage nodes D20 and D21 is amplified. The potentials of one of data storage nodes D20 and D21 attains the level of VDD whereas the other attains the level of GND.

At an elapse of a predetermined time defined by delay circuit DLY from the rise of local sense enable signal SE<0>, global word driver G16 is rendered active. Global word driver G16 drives global word line HWD<0> to an H level at time t3 (FIG. 4 (4)). Delay circuit DLY is provided for the purpose of delaying the activation timing of global word line HWD<0>. In other words, activation of global word line HWD<0> causes local sense amplifier SA1<0> to drive the retaining data to the global bit line pair. As will be described afterwards, delay circuit DLY is provided so that the data retained by local sense amplifier SA1<0> is applied to global bit line pair HBT, HBTC after being amplified sufficiently.

In accordance with the delay of the activation timing of global word line HWD<0>, the operation of global sense amplifier HSA must also be delayed. To this end, a clock CLK1 that is a delayed version of clock CLK by delay circuit DLY is applied to global dummy column HDC related to the operation of global sense amplifier HSA and to P channel MOS transistors P13, P11 and P12 directed to precharge global bit line pair HBT, HBTC.

In local sense amplifier SA1<0>, N channel MOS transistors N21 and N22 are rendered conductive when global word line HWD<0> attains an H level. In response, the potential of data storage node D20 is driven to global bit line HBT whereas the potential of data storage node D21 is driven to global bit line HBTC.

In global dummy column HDC, N channel MOS transistor NH10 is rendered conductive when global word line HWD<0> attains an H level. In response, global dummy bit line HDBT is set at an L level. This L level potential of global dummy bit line HDBT is inverted by an inverter G18. At time t4, global sense enable signal HSE is set at an H level (FIG. 4 (5)).

Since the driving capability of N channel MOS transistor NH10 is set larger than that of local sense amplifier SA1<0>, the rate of the potential drop of global dummy bit line HDBT becomes higher than the rate of the potential drop of global bit line HBT or HBTC. In the present specification, the driving capability of local sense amplifier SA1<0> corresponds to the amount of current flowing from N channel MOS transistor N21 to N channel MOS transistor N20 through N channel MOS transistor N25, or the amount of current flowing from N channel MOS transistor N22 to N channel MOS transistor N20 through N channel MOS transistor N26.

In global sense amplifier HSA, P channel MOS transistors P30 and P31 are rendered non-conductive whereas N channel MOS transistor N30 is rendered conductive when global sense enable signal HSE attains an H level. When P channel MOS transistors P30 and P31 are rendered non-conductive, global bit line pair H is isolated from data storage nodes D30 and D31. In response to conduction of N channel MOS transistor N30 the potential difference between data storage nodes D30 and D31 is amplified. One of the potentials of data storage nodes D30 and D31 attains the level of VDD whereas the other attains the level of GND. The potentials of data storage nodes D30 and D31 are retained at a latch formed of NAND circuits G30 and G31 to be output from a terminal DOUT.

Global sense enable signal HSE is inverted by an inverter G19 to be provided to global word drivers G16 and G17. Accordingly, all global word lines HWD attain a non-selected state. As a result, local sense amplifier SA1<0> suppresses the drive of global bit line pair HBT, HBTC. Therefore, reduction in the potential of global bit line pair HBT, HBTC is ceased. This ceasing timing is set to the time of one of global bit lines HBT and HBTC attaining the level of VDD−α(α=200 mV to 300 mV). This timing can be adjusted by altering the driving capability of N channel MOS transistors NH10 and NH11 in global dummy column HDC.

Thus, the potential amplitude of global bit line pair HBT, HBTC is restricted to a partial swing. Therefore, no current will flow from local sense amplifier SA1. In other words, local sense amplifier SA1<0> suppresses the drive of global bit line pair HBT, HBTC before the potential difference of global bit lines HBT, HBTC attains the level of VDD, and also renders global sense amplifier HSA active.

When clock CLK attains an L level at time t5, dummy bit line DBT is set at an H level in dummy column DC. In response, local sense enable signal SE<0> is set at an L level.

When clock CLK1 (delayed version of clock CLK) attains an L level, global dummy bit line HDBT is set at an H level in global dummy column HDC. Accordingly, global sense enable signal HSE is set at an L level.

Comparison with SRAM According to Background Art

Figure 5:
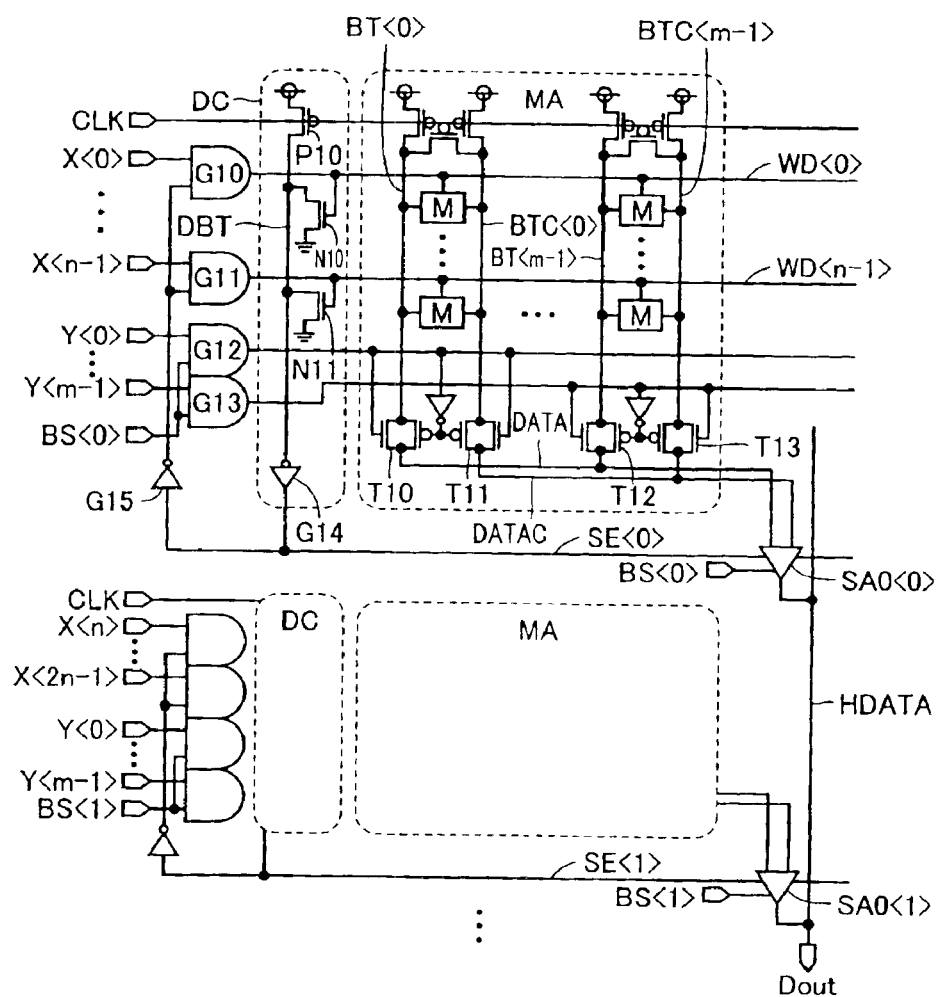
FIG. 5 shows a structure of a SRAM according to a background art.

The SRAM of the first embodiment will be compared with a SRAM according to a background art whose structure is shown in FIG. 5. The SRAM of FIG. 1 differs from the SRAM according to a background art of FIG. 5 in that a global bit line pair HBT, HBTC is provided instead of global data line HDATA of the SRAM according to a background art, a local sense amplifier SA1 is provided instead of local sense amplifier SA0, and a global sense amplifier HSA and a global dummy column HDC are provided, absent in the SRAM according to a background art.

Figure 6:
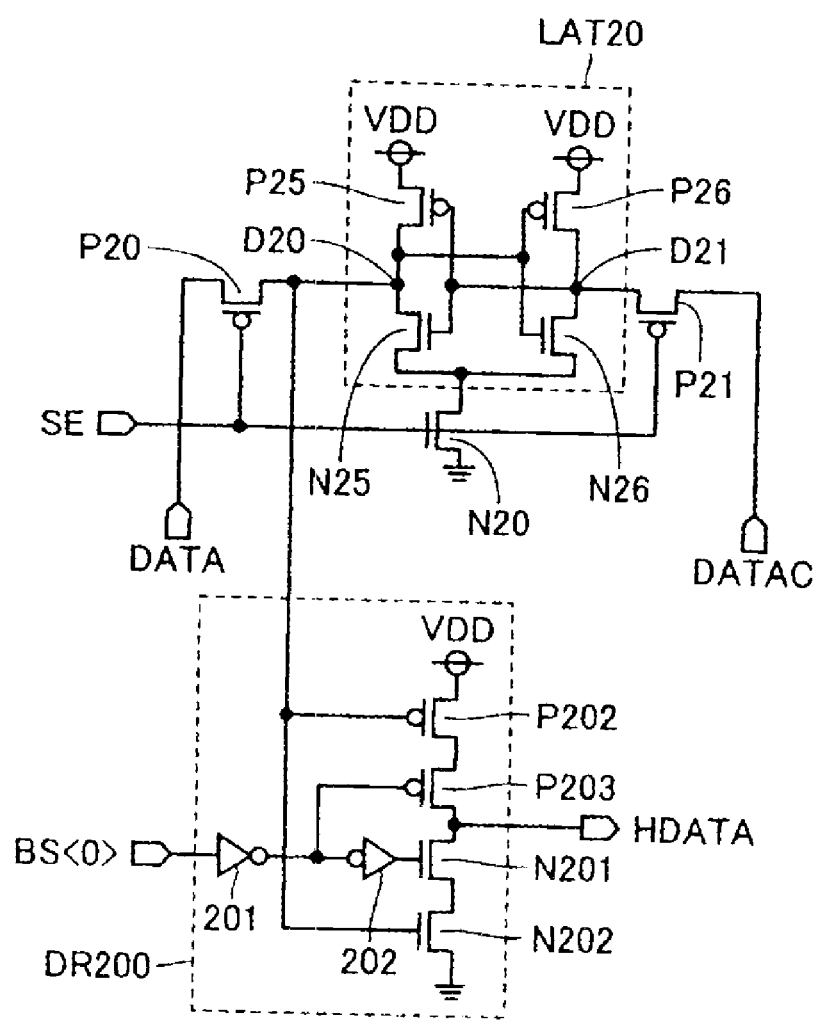
FIG. 6 shows a structure of a local sense amplifier SA0 according to a background art.

FIG. 6 shows a structure of a local sense amplifier SA0<0> according to a background art. When local sense enable signal SE<0> attains an H level in local sense amplifier SA0<0>, P channel MOS transistors P20 and P21 are rendered non-conductive whereas N channel MOS transistor N20 is rendered conductive. In response, the potential difference between data storage nodes D20 and D21 is amplified, whereby one of the potentials of data storage nodes D20 and D21 attain a VDD level whereas the other attains a GND level.

When block select signal BS<0> attains an H level in an output buffer DR200, a P channel MOS transistor P203 and an N channel MOS transistor N201 are rendered conductive. Therefore, when the potential of data storage node D20 is at an L level, N channel MOS transistor N202 is rendered conductive. The potential of global data line HDATA attains an L level. When the potential of data storage node D20 attains an L level, P channel MOS transistor P202 is rendered conductive. The potential of global data line HDATA attains an L level.

Thus, the global data line HDATA according to a background art attains a full swing whereas the potential amplitude of global bit line pair HBT, HBTC is restricted to a partial swing in the SRAM of the present embodiment. Therefore, power consumption can be reduced.

In the SRAM of the present embodiment, data can be read out from a memory cell in hierarchy by a local memory circuit formed of local data line pair DATA, DATAC, word line WD, dummy column DC, and local sense amplifier SA1 operating in a manner similar to that of a global memory circuit formed of global bit line pair HBT, HBTC, global word line HWD, global dummy column HDC and global sense amplifier HSA. Although the present embodiment is based on a hierarchy structure of two levels, the present invention can be extended to a hierarchy structure of more than two levels. For example, in a hierarchy of three levels, the memory cell array is divided into 2 stages. Specifically, the memory cell array is first divided into large blocks, and then further subdivided into smaller blocks. A plurality of global memory circuits can be provided corresponding to the subblocks, and one global memory circuit can be provided corresponding to the large blocks.

Second Embodiment

The second embodiment is directed to an SRAM having a write function added to the SRAM of the first embodiment.

Entire Structure

Figure 7:
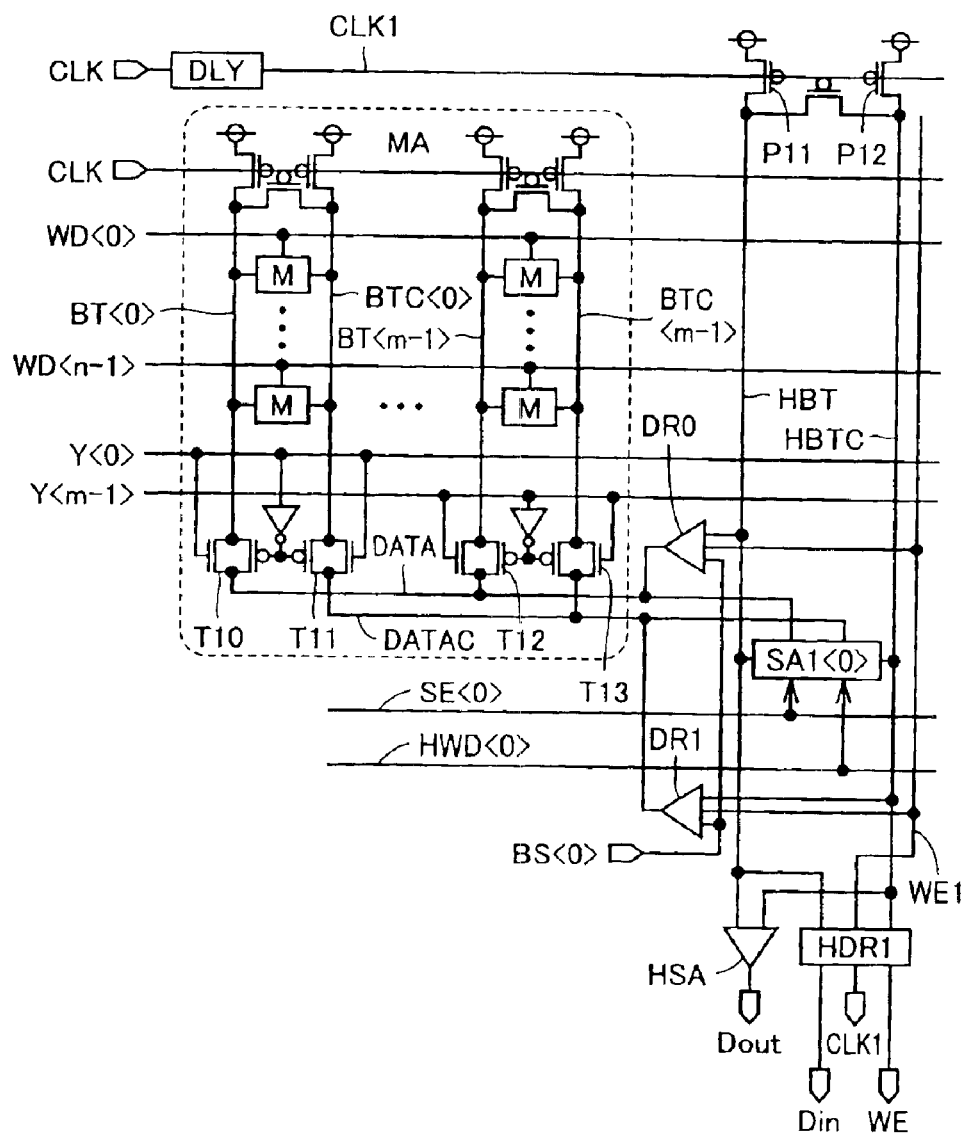
FIG. 7 shows a structure of a main part of an SRAM according to a second embodiment of the present invention.

FIG. 7 shows a structure of a main part of an SRAM of the second embodiment. FIG. 7 depicts only the structure of circuitry required for writing to the 0th block. The SRAM of the second embodiment corresponds to the SRAM of FIG. 1, provided that a global write driver HDR1 and local write drivers DR0 and DR1 are added. These additional elements will be described hereinafter.

Global Write Driver HDR1

Figure 8:
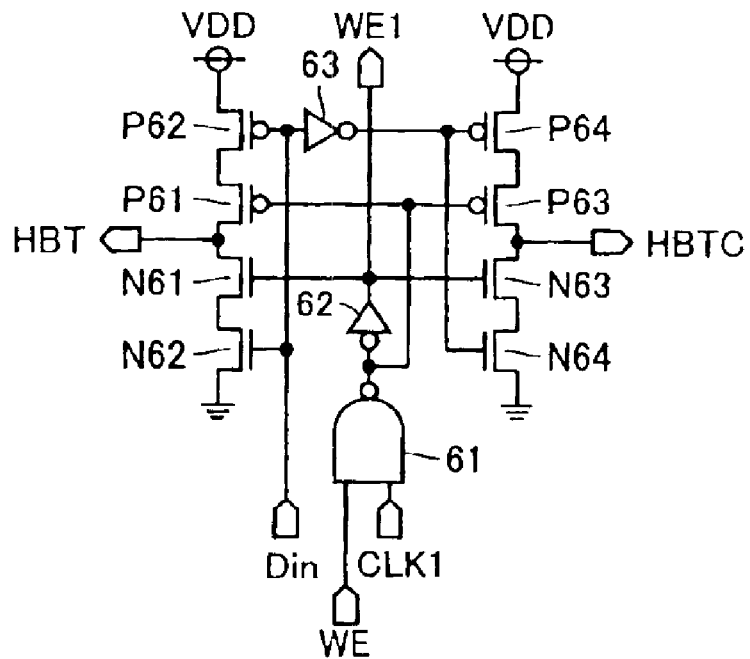
FIG. 8 shows a structure of a global write driver HDR1 of the second embodiment.

FIG. 8 shows a structure of global write driver HDR1 of the second embodiment. A write designation signal WE, a delay clock CLK1, and write data Din are input to global write driver HDR1. Externally applied write designation signal WE attains an H level when writing is designated.

Global write signal WE1 attains an H level only when write designation signal WE is at an H level and delay clock CLK1 is at an H level. When global write signal WE1 is at an H level, P channel MOS transistors P61 and P63 conduct. Also, N channel MOS transistors N61 and N63 conduct.

When write data Din is at an H level in such a case, N channel MOS transistor N61 and P channel MOS transistor P64 are rendered conductive. The data of global bit line HBT attains an L level, whereas the data of global bit line HBTC attains an H level. In the case where write data Din is at an L level, P channel MOS transistor P62 and N channel MOS transistor N64 are rendered conductive. The data of global bit line HBT attains an H level whereas the data of global bit line HBTC attains an L level.

When write designation signal WE is at an L level or delay clock CLK1 is at an L level, global write driver HDR1 provides a high impedance output to global bit line pair HBT, HBTC.

Local Write Drivers DR0, DR1

Figure 9:
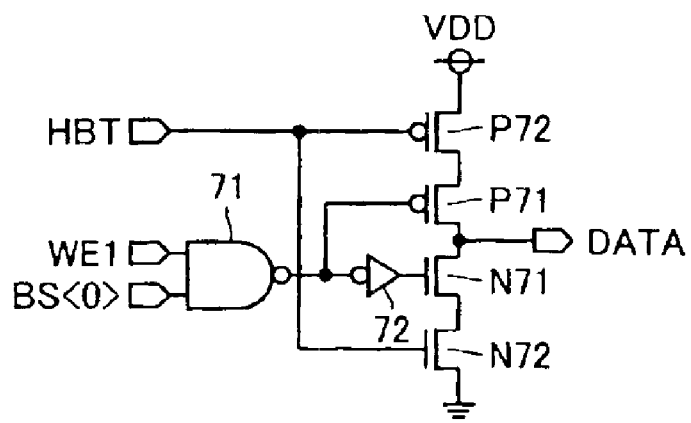
FIG. 9 shows a structure of a local write driver DR0 of the second embodiment.

FIG. 9 shows a structure of a local write driver DR0 of the present embodiment. A global write signal WE1, a block select signal BS<0>, and the data of global bit line HBT are applied to local write driver DR0. Local write driver DR0 provides a data output to local data line DATA. Externally applied block select signal BS<0> attains an H level when the 0th block is selected.

When global write signal WE1 is at an H level and block select signal BS<0> is at an H level, NAND gate 71 provides an output of an L level. P channel MOS transistor P71 and N channel MOS transistor N71 conduct.

When the data of global bit line HBT is at an H level in such a case, N channel MOS transistor N72 is rendered conductive. The data of local data line DATA attains an L level. When the data of global bit line HBT attains an L level, N channel MOS transistor P72 is rendered conductive. The data of local data line DATA attains an H level.

When global write signal WE1 is at an L level or when block select signal BS<0> is at an L level, local write driver DR0 provides a high impedance output to local data line pair DATA, DATAC.

The structure of local write driver DR1 is similar to that of local write driver DR0 described previously. Therefore, the description of the structure of local write driver DR1 will not be repeated. In the case where global write signal WE1 is at an H level and block select signal BS<0> is at an H level, local write driver DR1 drives the data of local data line DATAC to an L level and an H level when the data on global bit line HBTC is at an H level and an L level, respectively.

Thus, the data driven to local data line pair DATA, DATAC is written into the target memory cell by the selection of local word line WD and local bit line pair BT, BTC.

According to the SRAM of the second embodiment, not only a read out operation, but also a write operation, can be carried out in hierarchy.

The present embodiment is based on a structure in which two local write drivers DR0 and DR1 are provided corresponding to one block. The two local write drivers DR0 and DR1 can be taken as one local write driver.

Third Embodiment

The third embodiment is directed to an SRAM dispensable of a write signal WE1 used to control a writing operation in the previous second embodiment.

Entire Structure

Figure 10:
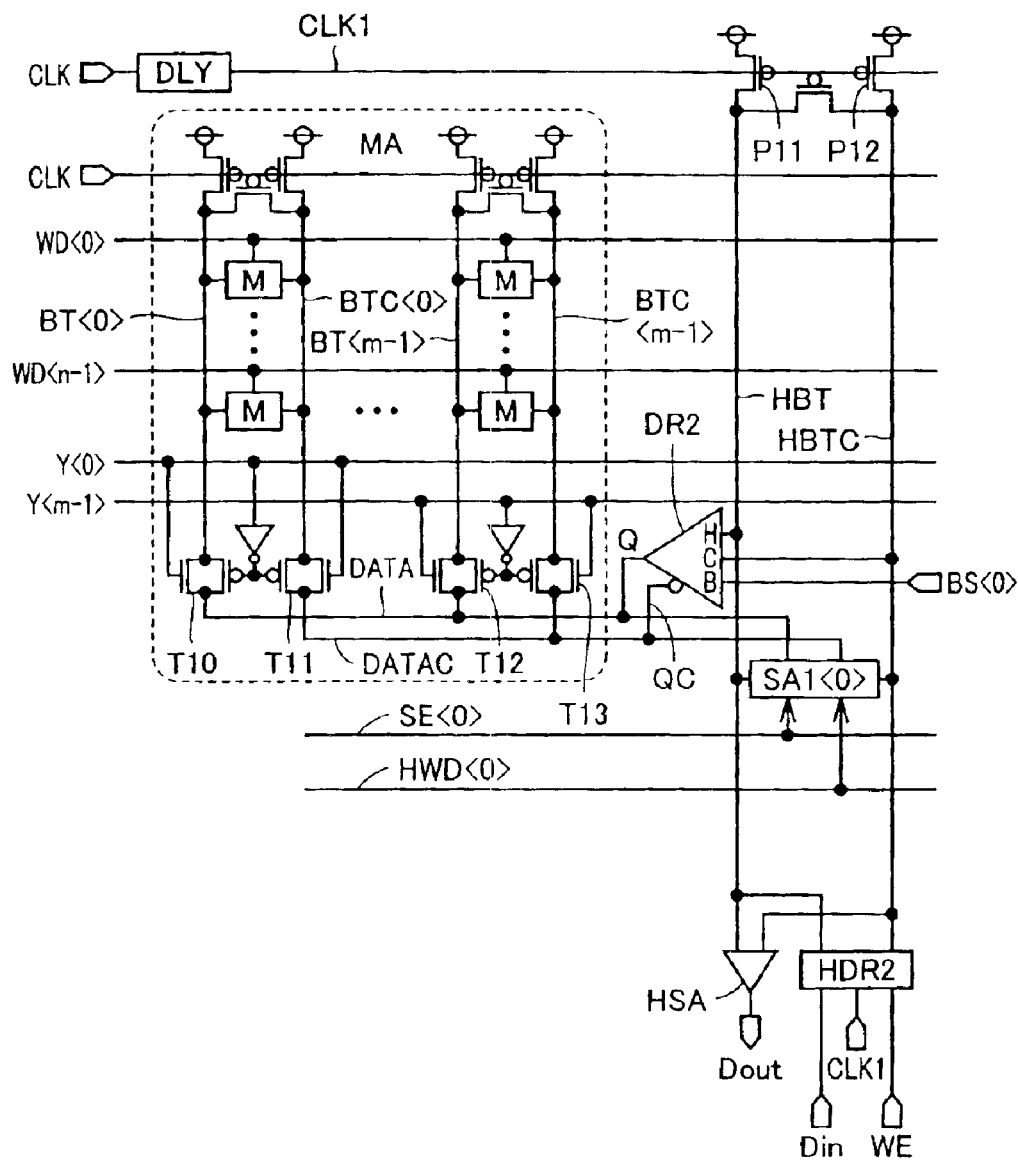
FIG. 10 shows a structure of a main part of an SRAM according to a third embodiment of the present invention.

FIG. 10 shows a structure of a main part of an SRAM of the third embodiment. FIG. 10 depicts only the structure of circuitry required for writing to the 0th block. The SRAM of the third embodiment shown in FIG. 10 differs from the SRAM of the second embodiment shown in FIG. 7 in the inclusion of a global write driver HDR2 instead of global write driver HDR1, and one local write driver DR2 instead of two local write drivers DR0 and DR1. These elements will be described hereinafter.

Structure of Global Write Driver HDR2

Figure 11:
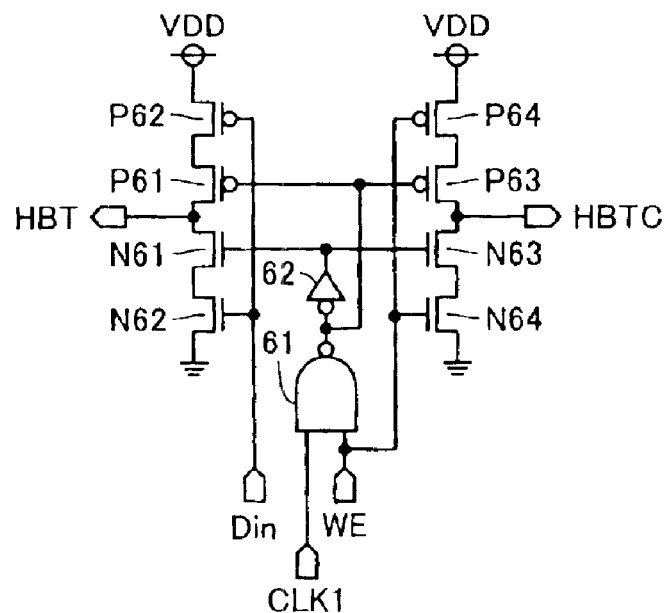
FIG. 11 shows a structure of a global write driver HDR2 of the third embodiment.

FIG. 11 shows a structure of global write driver HDR2 of the third embodiment. A write designation signal WE, a delay clock CLK1, and write data Din are input to global write driver HDR2.

Only when both write designation signal WE and delay clock CLK1 attain an H level, P channel MOS transistors P61 and P63 are rendered conductive and N channel MOS transistors N61, N63 and N64 are rendered conductive. Accordingly, the data of global bit line HBTC attains an L level. Thus, the present embodiment is characterized in that, when writing is designated through write designation signal WE, global bit line HBTC is set at an L level instead of global write signal WE1 being set at an H level.

When write data Din is at an H level in this case, N channel MOS transistor N62 is rendered conductive. The data of global bit line HBT attains an L level. In contrast, when write data Din is at an L level, P channel MOS transistor MOS transistor P62 is rendered conductive. Data of global bit line HBT attains an H level. Accordingly, write data Din is driven to global bit line HBT.

In the case where write designation signal WE is at an L level or delay clock CLK1 is at an L level, global write driver HDR2 provides a high impedance output to global bit line pair HBT, HBTC.

Structure of Local Write Driver DR2

Figure 12:
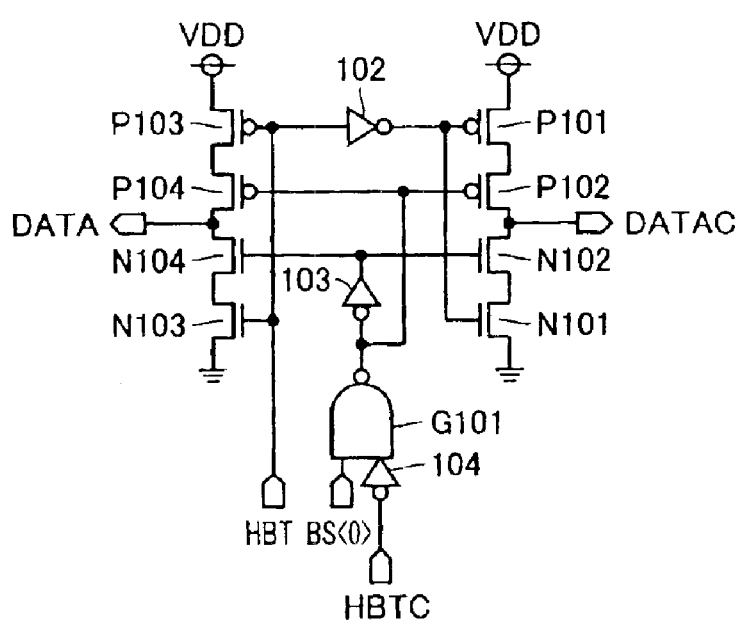
FIG. 12 shows a structure of a local write driver DR2 of the third embodiment.

FIG. 12 shows a structure of local write driver DR2 of the present embodiment. The data on local bit line HBT, block select signal BS<0>, and the data on global bit line HBTC are applied to local write driver DR2.

P channel MOS transistors P102 and P104, and N channel MOS transistors N102 and N104 are rendered conductive only when block select signal BS<0> is at an H level and global bit line HBTC is at an L level.

When global bit line HBT is at an H level in such a case, N channel MOS transistor N103 and P channel MOS transistor P101 are rendered conductive. Accordingly, the data of local data line DATA attains an L level whereas the data of local data line DATAC attains an H level.

When global bit line HBT attains an L level, P channel MOS transistor P103 and N channel MOS transistor N101 are rendered conductive. Accordingly, the data of local data line DATA attains an H level whereas the data of local data line DATAC attains an L level.

When block select signal BS<0> is at an L level, or when global bit line HBTC is at an H level, local write driver DR2 provides an output of high impedance to local data line pair DATA, DATAC.

Relationship with Read Out Operation

It is appreciated from the above description that local write driver DR2 uses global bit line HBTC for write control. In a read out mode, this local bit line HBTC may be set to an L level. Erroneous designation of writing must be obviated for local write driver DR2 when global data line HBTC attains an L level in a data read mode. This is realized as set forth below.

As described in the first embodiment, global bit line pair HBT, HBTC does not attain a full swing in a read mode. In other words, the potential drop of global bit line HBTC is restricted to 200 mV to 300 mV. Therefore, the threshold value of input inverter 104 of local write driver DR2 is set lower than 200 mV. Accordingly, input inverter 104 provides an output of an L level even if global bit line HBTC is set at an L level in a read mode since the potential is in the range of 200 mV to 300 mV. When global bit line HBTC is set at an L level indicating write designation in a write mode, input inverter 104 provides an H level output. Therefore, even if global data line HBTC attains an L level by a data read out operation, local write driver DR2 will not accept the pull down of global data line HBTC to an L level as writing designation.

When global bit line HBTC is at an L level, global bit line HBT attains an H level in a read mode. Global bit lines HBT, HBTC attain such potential level since local data lines DATA and DATAC attain an H level and an L level, respectively, by the data read out from memory cell M.

In this case, in response to global bit line HBTC attaining an L level, local write driver DR2 drives local data lines DATA and DATAC to an L level and an H level, respectively. Accordingly, data is written into memory cell M. However, the data in memory cell M will not change.

According to the SRAM of the third embodiment, the signal line of write signal WE1 is dispensable by sending write designation through a global bit line. The circuitry area can be reduced. Also, power consumption can be reduced.

Fourth Embodiment

The fourth embodiment of the present invention is directed to an SRAM having a sense amplifier and write driver combined.

Entire Structure

Figure 13:
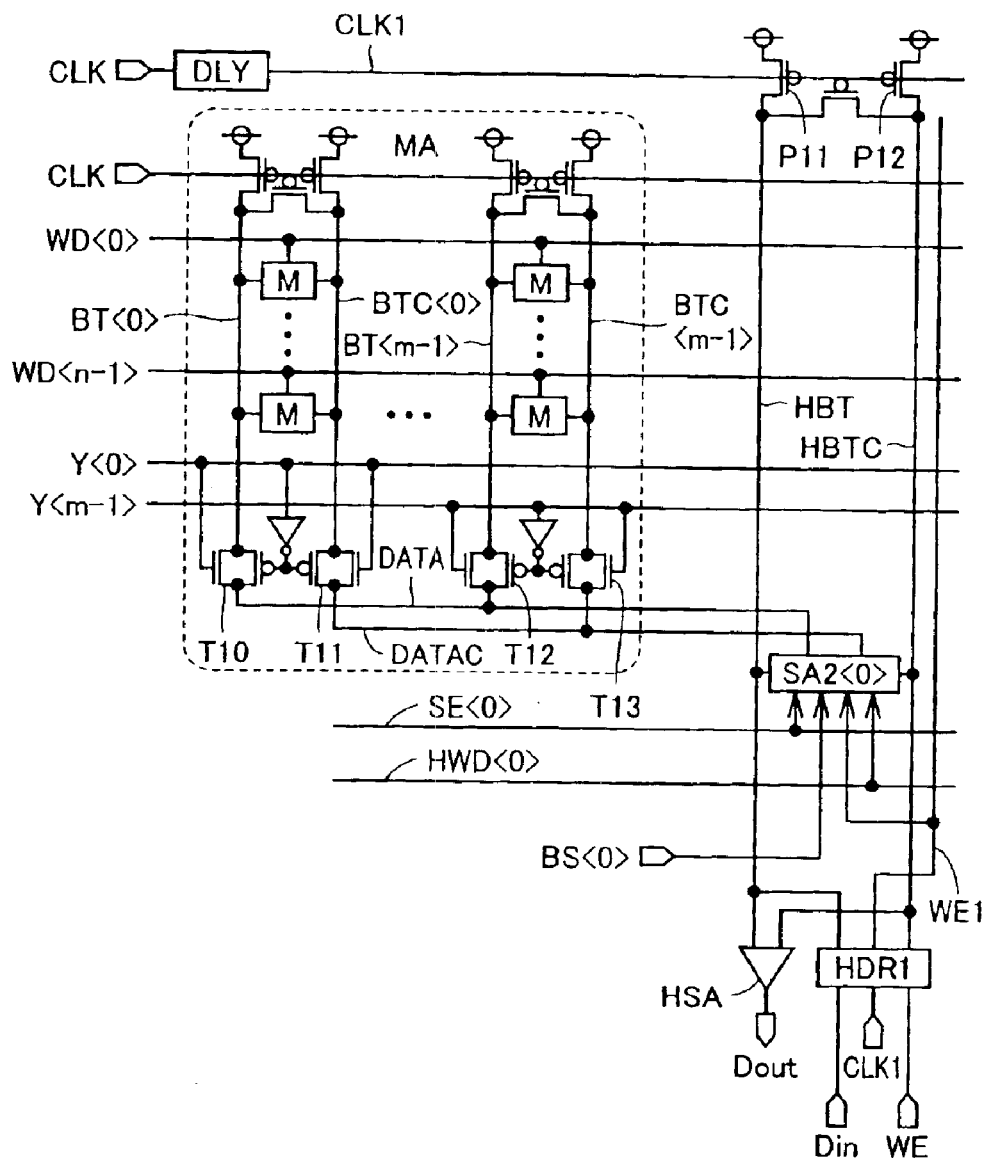
FIG. 13 shows a structure of a main part of an SRAM according to a fourth embodiment of the present invention.

FIG. 13 shows a structure of a main part of an SRAM of the fourth embodiment. FIG. 13 shows only a structure of circuitry required for writing to the 0th block. The SRAM of the fourth embodiment differs from the SRAM of the second embodiment shown in FIG. 7 in that one local sense amplifier SA2 equipped with a write function is provided instead of a local sense amplifier SA1 and two local write drivers DR0 and DR1. These elements will be described hereinafter.

Structure of Local Sense Amplifier SA2 Equipped with a Write Function

Figure 14:
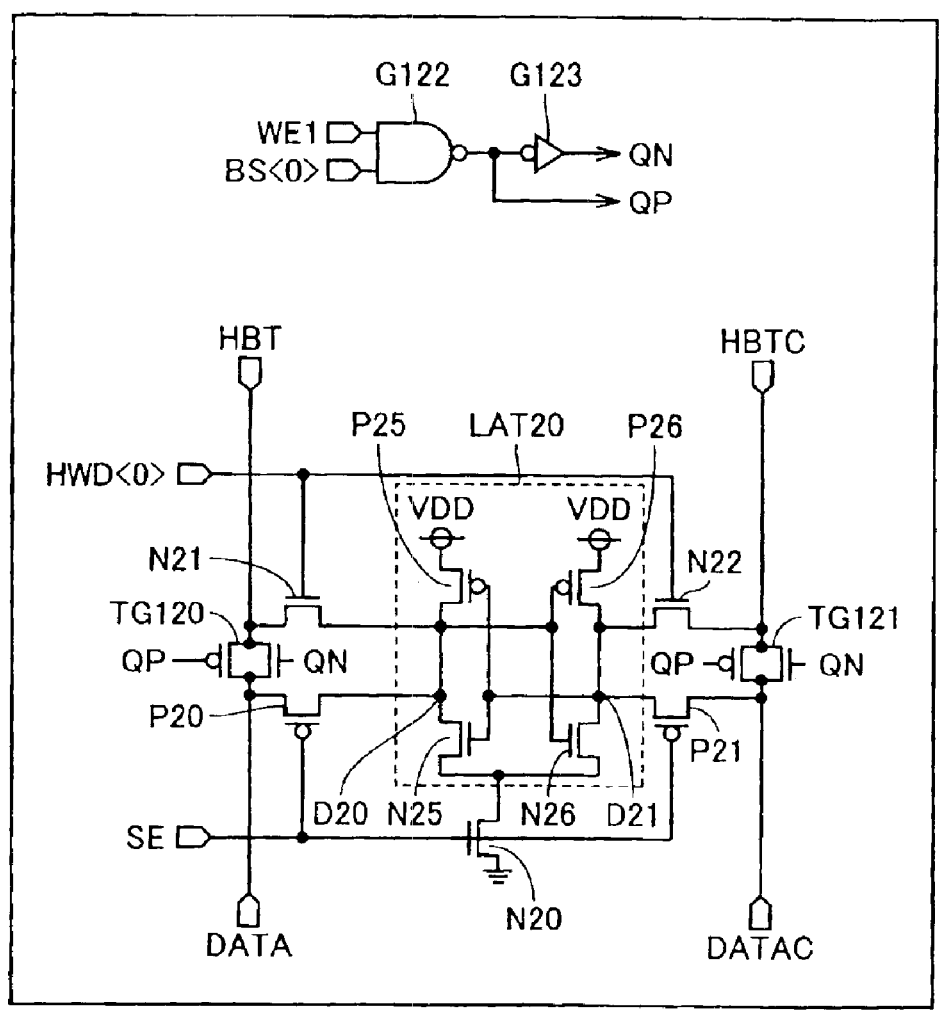
FIG. 14 shows a structure of a local sense amplifier SA2 equipped with a write function of the fourth embodiment.

FIG. 14 shows a structure of a local sense amplifier SA2<0> equipped with a write function of the fourth embodiment. This local sense amplifier SA2<0> has transmission gates TG120 and TG121 added to local sense amplifier SA1<0> of FIG. 2. Transmission gates TG120 and TG121 are under control of control signals QN and QP. Control signals QN and QP are generated by a NAND gate G122 and an inverter 123 based on global write signal WE1 and block select signal BS<0>.

Control signals QN and QP attain an H level and an L level, respectively, only when both global write signal WE1 and block select signal BS<0> are at an H level. In this case, transmission gates TG120 and TG121 are rendered conductive. As a result, global bit line pair HBT, HBTC is connected with global data line pair DATA, DATAC.

When global write signal WE1 is at an L level or block select signal BS<0> is at an L level, control signals QN and QP attain an L level and an H level, respectively. Transmission gates TG120 and TG121 are rendered non-conductive. As a result, global bit line pair HBT, HBTC is not connected with local data line pair DATA, DATAC.

The operation of local sense amplifier SA2<0> equipped with a write function will be described hereinafter, corresponding to a read operation and a write operation.

Read Operation

In a read mode, transmission gates T120 and TG121 are rendered non-conductive since global write signal WE1 is at an L level. Therefore, global bit line pair HBT, HBTC is not connected with local data line pair DATA, DATAC. In this case, local sense amplifier SA2<0> operates in a manner similar to that of local sense amplifier SA1<0> of FIG. 2.

Write Operation

In a write mode, global write signal WE1 is at an H level. Therefore, transmission gates TG120 and TG121 are rendered conductive when block select signal BS<0> is at an H level. Accordingly, global bit line pair HBT, HBTC is connected with local data line pair DATA, DATAC.

Global bit line pair HBT, HBTC has the data to be written output by global write driver HDR1. Therefore, the relevant data are transferred to local data lines DATA, DATAC via transmission gates TG120 and TG121 attaining a conductive state.

By just adding two transmission gates TG120 and TG121, a NAND gate G122 and an inverter G123 to the local sense amplifier in the present embodiment, the local sense amplifier can also function as a local write driver. The number of elements can be reduced than in the second embodiment where a single local write driver is provided. Accordingly, the circuitry area can be reduced. Also, power consumption can be reduced.

Fifth Embodiment

The fifth embodiment is directed to an SRAM that drives local data line pair DATA, DATAC, absent of a transmission gate. In the previous fourth embodiment, local sense amplifier SA2 equipped with a write function has local data line pair DATA, DATAC driven via transmission gates. It is known that, since the transmission gate has a low driving capability, one of the potentials of local data lines DATA, DATAC cannot be set low enough when the parasitic capacitance of local data line pair DATA, DATAC is large. This means that data cannot be written into a memory cell. The present embodiment is directed to overcome such a problem.

Entire Structure

Figure 15:
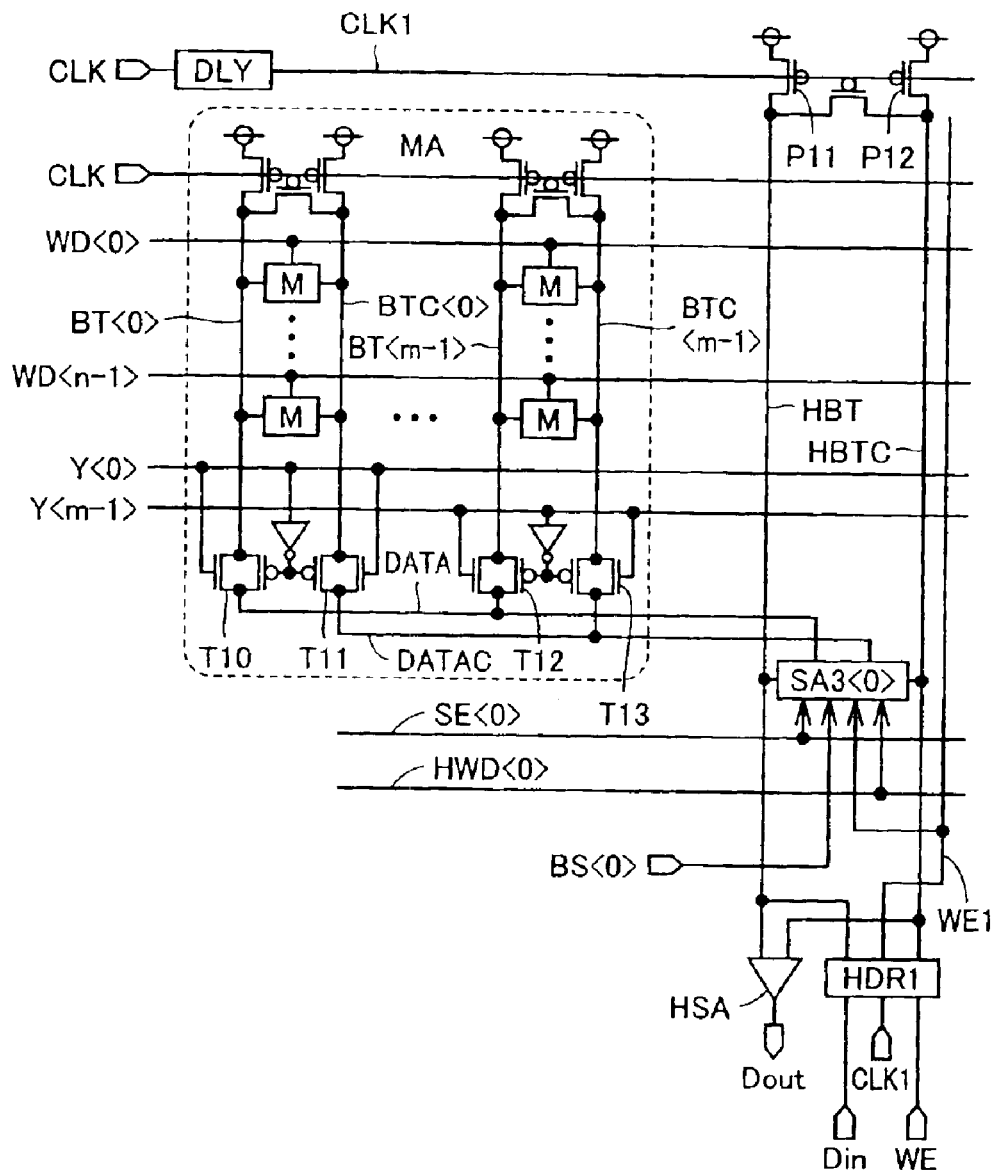
FIG. 15 shows a structure of a main part of an SRAM according to a fifth embodiment of the present invention.

FIG. 15 shows a structure of a main part of an SRAM according to the fifth embodiment. FIG. 15 shows only the structure of circuitry required for writing to the 0th block. The SRAM of the fifth embodiment differs from the SRAM of the fourth embodiment shown in FIG. 13 in that a local sense amplifier SA3 equipped with a write function is provided instead of local sense amplifier SA2 equipped with the write function.

Structure of Local Sense Amplifier SA3

Figure 16:
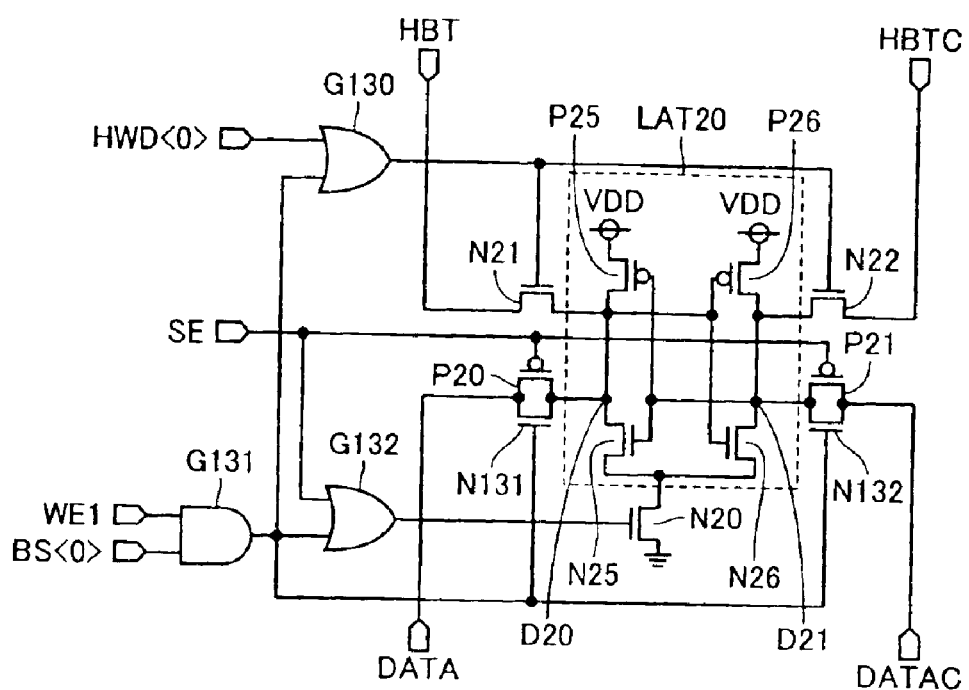
FIG. 16 shows a structure of a local sense amplifier SA3 equipped with a write function of the fifth embodiment.

FIG. 16 shows a structure of a local sense amplifier SA3<0> equipped with a write function of the fifth embodiment. Local sense amplifier SA3<0> of the fifth embodiment differs from local sense amplifier SA2<0> of FIG. 14 in that global bit line pair HBT, HBTC will not be directly connected with local data line pair DATA, DATAC. Also, N channel MOS transistors N131 and N132 are added between local data line pair DATA, DATAC and data storage nodes D20 and D21 in latch & amplify circuit LAT20. Furthermore, an OR gate G130, an AND gate G131 and an OR gate G132 are also added.

The operation of local sense amplifier SA3<0> equipped with a write function will be described, corresponding to a read mode and a write mode.

Read Operation

In a read out mode, local sense amplifier SA3<0> operates in a manner similar to that of local sense amplifier SA1<0> shown in FIG. 2, as set forth below.

Since global write signal WE1 is at an L level in a read mode, AND gate G131 provides an L level output. In response, N channel MOS transistors N131 and N132 are rendered non-conductive.

P channel MOS transistors P20 and P21 conduct during an L level period of local sense enable signal SE<0>. Accordingly, the potentials of local data lines DATA, DATAC are set at data storage nodes D20 and D21.

Then, P channel MOS transistors P20 and P21 are rendered non-conductive during an H level period of local sense enable signal SE<0>. Also, since OR gate G132 provides an H level output, N channel MOS transistor N20 is rendered conductive. Accordingly, the potential difference between data storage nodes D20 and D21 is amplified. One of the potentials of data storage nodes D20 and D21 attains a VDD level whereas the other attains the GND level.

When global word line HWD<0> attains an H level, N channel MOS transistors N21 and N22 conduct since OR gate G130 provides an H level output. Accordingly, the potentials of data storage nodes D20 and D21 are transferred to global bit line pair HBT, HBTC.

Write Operation

In a write operation, global write signal WE1 is at an H level. Therefore, OR gate G130 provides an H level output when block select signal BS<0> is at an H level. Accordingly, N channel MOS transistors N21 and N22 are rendered conductive. Therefore, the potentials of global bit line pair HBT, HBTC corresponding to the write data are set at data storage nodes D20 and D21. At this stage, N channel MOS transistor N20 is also rendered conductive since OR gate G132 provides an H level output. Thus, write data is fetched into latch & amplify circuit LAT20.

At this stage, N channel MOS transistors N131 and N132 are rendered conductive since AND gate G131 provides an H level output. Accordingly, one of local data lines DATA and DATAC is discharged based on the write data in latch & amplify circuit LAT20, whereby the potential falls to the level of GND.

Since local data line pair DATA, DATAC and latch & amplify circuit LAT20 are connected via N channel MOS transistors (N131, N132), the potential of one of the local data lines can be lowered to the level of GND. In the case where a P channel MOS transistor is employed instead of an N channel MOS transistor, the potential of the local data line can be reduced only down to the level of threshold voltage Vthp of the P channel MOS transistor.

Thus, the potential of one of local data lines DATA, DATAC charged to the level of VDD can be reduced down to the GND level during a precharge period.

According to the SRAM of the present embodiment, local data line pair DATA, DATAC is driven via N channel MOS transistors N31 and N132 establishing connection between latch & amplify circuit LAT20 and local data line pair DATA, DATAC based on the write data set at global bit line pair and applied to latch & amplify circuit LAT20. Therefore, data can be written into a memory cell even in the case where local bit line pair BT, BTC has a large parasitic capacitance.

Sixth Embodiment

The sixth embodiment of the present invention is directed to an SRAM having the potential amplitude of a global bit line pair restricted to a partial swing in a write mode. In the previous second to fifth embodiments, the potential of one of global bit lines HBT and HBTC is set at the level of VDD whereas the other is set at the level of GND in a write mode. When the potentials of global bit lines HBT and HBTC attain a full swing in a write mode, power consumption will be increased. There is also a possibility of erroneous writing carried out as set forth below.

In a write mode, the word line connected to a target memory cell of writing is rendered active, and write data is set at the bit line pair connected to the memory cell of interest. The word line rendered active has a plurality of memory cells connected other than those of the subject of writing. These memory cells will also attain a writable selected state, likewise the memory cell subject to writing. This is called a pseudo selected state.

Global bit lines HBT, HBTC and local bit lines BT, BTC are interconnected with separate interconnection layers. These interconnections are arranged so as to be in parallel. As a result, parasitic capacitance is established between the interconnections. In the case where the potential of the global bit line changes greatly through the parasitic capacitance, this potential change is propagated to the local bit line. This is referred to as "capacitive coupling".

If the potential of the global bit line attains a full swing by such capacitive coupling, this potential change will be propagated to the bit line pair connected to the memory cell attaining a pseudo selected state. As a result, erroneous writing to the pseudo selected cell will be conducted. The present embodiment is directed to prevent such erroneous writing as well as to reduce power consumption by restricting the potential amplitude of a global bit line pair to a partial swing.

Entire Structure

Figure 17:
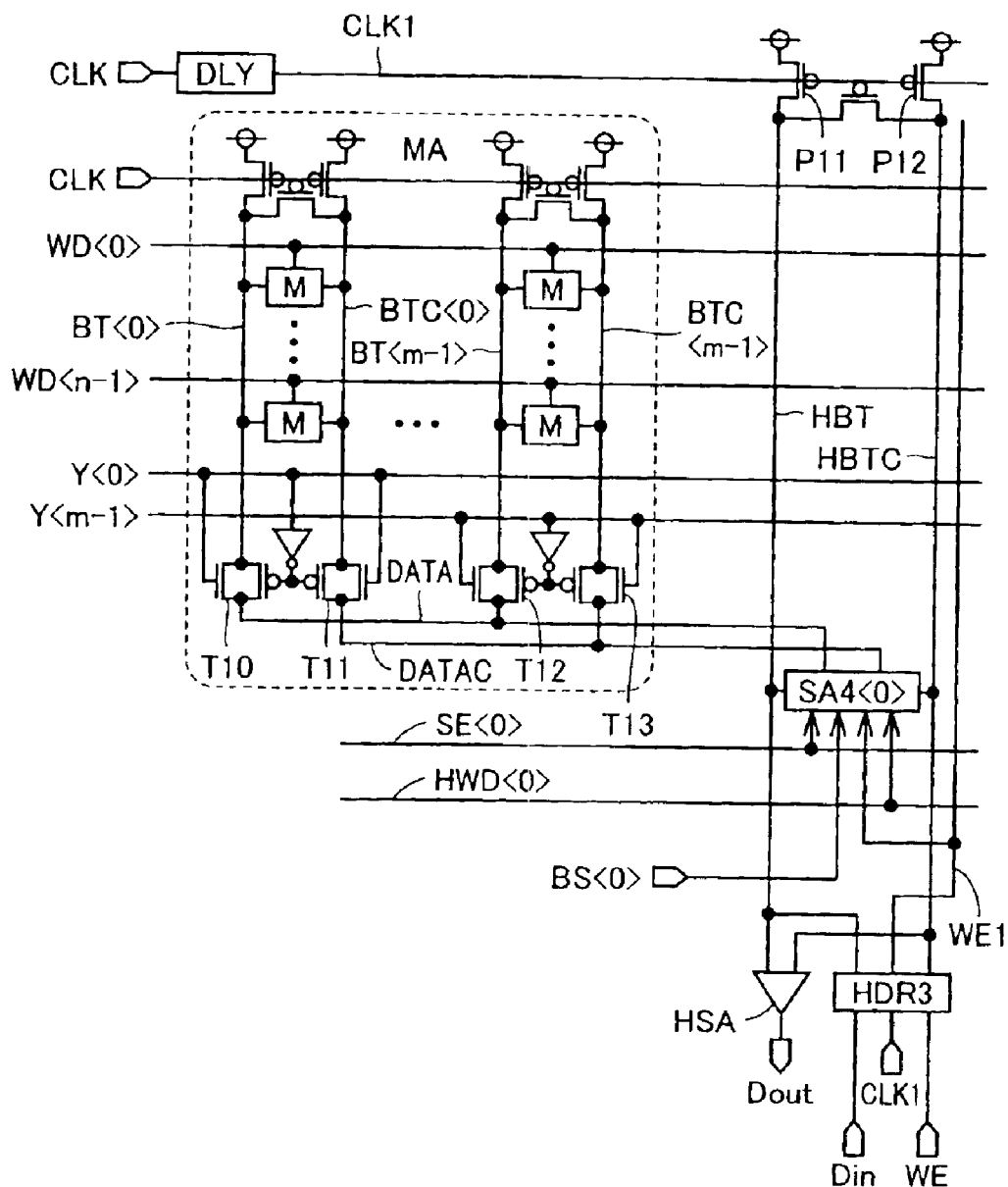
FIG. 17 shows a structure of a main part of an SRAM according to a sixth embodiment of the present invention.

FIG. 17 shows a structure of a main part of an SRAM of the sixth embodiment. FIG. 17 shows only a structure of circuitry required for writing to the 0th block. The SRAM of the sixth embodiment differs from the SRAM of the fifth embodiment shown in FIG. 15 in that a global write driver HDR3 is provided instead of global write driver HDR1, and a local sense amplifier SA4 equipped with a write function is provided instead of local sense amplifier SA3 equipped with a write function. The structural elements will be described hereinafter.

Global Write Driver HDR3

Figure 18:
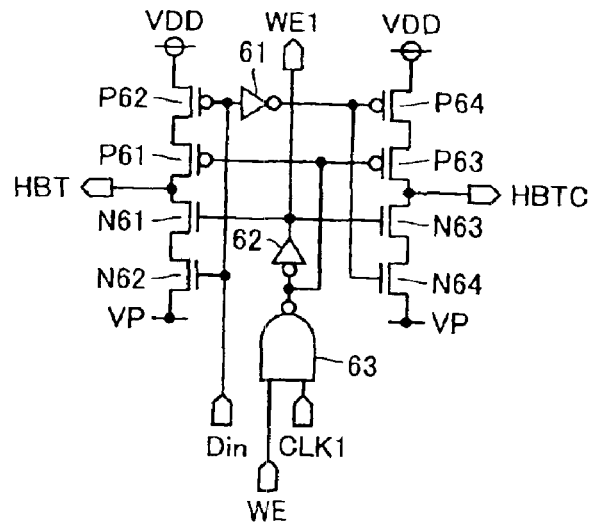
FIG. 18 shows a structure of a global write driver HDR3 of the sixth embodiment.

FIG. 18 shows a structure of global write driver HDR3 of the sixth embodiment. This global write driver HDR3 has a circuit structure similar to that of global write driver HDR1 of the second embodiment shown in FIG. 8, provided that one of the potentials supplied to global write driver HDR3 is at the level of VP instead of GND.

Potential VP is higher in level than potential GND. If the potential drop of the global bit line in a write mode is to be set equal to that of a read mode, potential VP is to be set at a level lower than VDD by approximately 200–300 mV. This potential VP may be applied from an external source, or generated within the SRAM.

Local Sense Amplifier SA4 Equipped with Write Function

Figure 19:
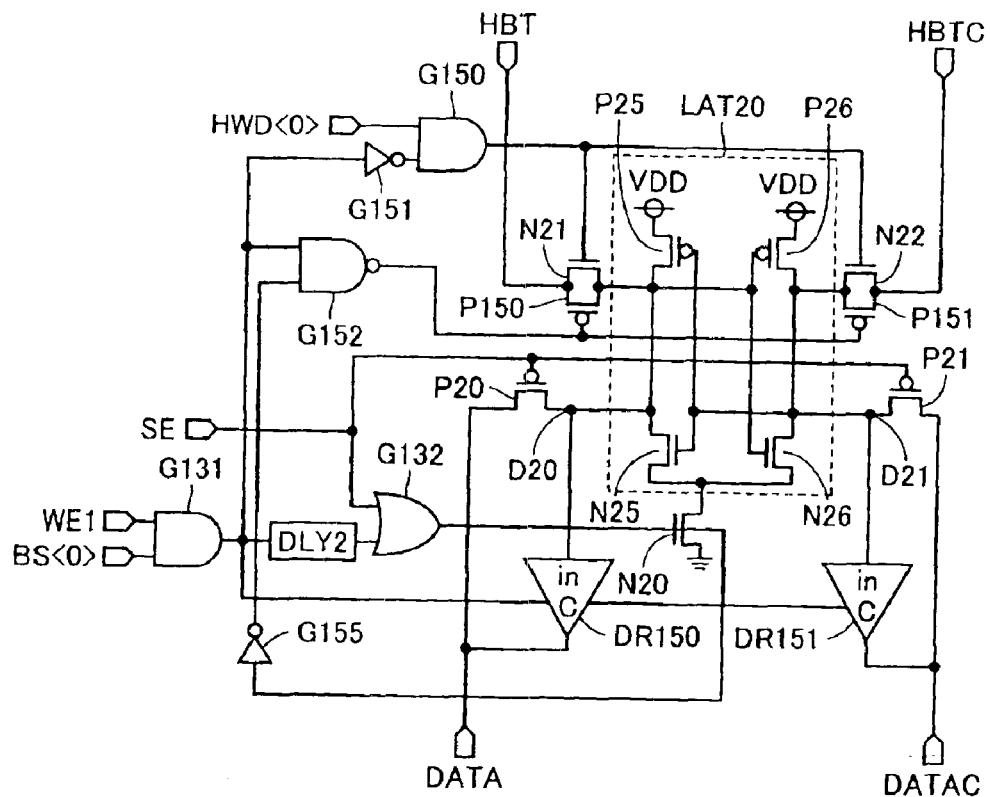
FIG. 19 shows a structure of a local sense amplifier SA4 equipped with a write function of the sixth embodiment.

FIG. 19 shows a structure of a local sense amplifier SA4<0> equipped with a write function according to the sixth embodiment. Local sense amplifier SA4<0> differs from local sense amplifier SA3<0> of the fifth embodiment shown in FIG. 16 in that P channel MOS transistors P150 and P151 as well as local write drivers DR150 and DR151 are added. Also, N channel MOS transistors N131 and N132 are removed, and a NAND gate G152, inverters G151 and G155, a delay circuit DLY2, and an AND gate G150 are additionally provided.

Local Write Drivers DR150, DR151

Figure 20:
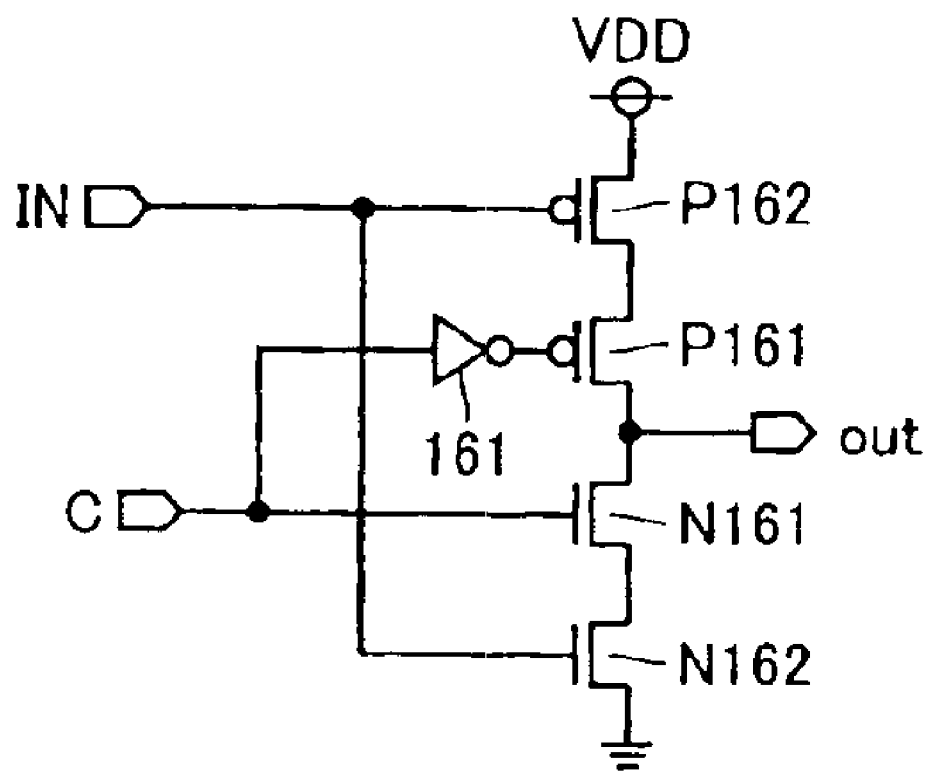
FIG. 20 shows a structure of a local write driver DR150 of the sixth embodiment.

FIG. 20 shows a structure of a local drive driver DR150 of the sixth embodiment. Local write driver DR150 receives the potential of data storage node D20 through a terminal IN and receives the potential output from AND gate G131 through a terminal C.

AND gate G131 provides an H level output, whereby P channel MOS transistor P161 and N channel MOS transistor N161 are rendered conductive only when both a global write signal WE1 and block select signal BS<0> attain an H level. If the potential of data storage node D20 is at an H level in this stage, an L level output is provided to local data line DATA. When the potential of data storage node D20 attains an L level, an H level output is provided to local data line DATA.

The structure of local write driver DR151 is similar to that of local write driver DR150 described above. Therefore, illustration thereof will not be repeated. When global write signal WE1 and block select signal BS<0> are at an H level, local write driver DR151 provides an L level output and an H level output to local data line DATAC when the potential of data storage node D21 is at an H level and an L level, respectively.

A read operation and write operation of the SRAM of the sixth embodiment will be described hereinafter.

Read Operation

In a read mode, AND gate G131 provides an L level output since global write signal WE1 is at an L level in local sense amplifier SA4<0> equipped with a write function. Accordingly, local write drivers DR150 and DR151 provide a high impedance output. Since NAND gate G152 provides an H level output, P channel MOS transistors P150 and P151 are rendered non-conductive. AND gate G150 provides an output of a logic level identical to that of global word line HWD<0>.

Thus, the read operation of the present embodiment is similar to the read operation of the previous fifth embodiment.

Write Operation

In a write operation mode, global write driver HDR3 drives one of the potentials of global bit lines HBT and HBTC to the level of VDD and the other potential to the level of VP according to write data Din.

Since global write signal WE1 is at an H level in local sense amplifier SA4<0> equipped with a write function, AND gate G131 provides an H level output and NAND gate G152 provides an L level output when block select signal BS<0> is at an H level, whereby P channel MOS transistors P150 and P151 are rendered conductive. Accordingly, the potential of global bit line HBT is transferred to data storage node D20 the potential of global bit line HBTC is transferred to data storage node D21.

Since data storage nodes D20 and D21 are connected to the global bit line pair via P channel MOS transistors (P150, P151), the potentials of VDD and VP can be transferred without any loss to data storage nodes D20 and D21.

In the case where an N channel MOS transistor is employed instead of a P channel MOS transistor, the potential of only VDD–Vthn at most can be transferred to data storage nodes D20 and D21 when the N channel MOS transistor has a threshold voltage of Vthn. Therefore, the potential of one of data storage nodes D20 and D21 attains the level of VDD–Vthn, whereas the potential of the other node attains the level of VP. If VP> VDD–Vthn is set in such a case, the write data cannot be properly set at data storage nodes D20 and D21. This problem can be obviated by the usage of P channel MOS transistors.

At an elapse of a predetermined period of time defined by delay circuit DLY2 from the conduction of P channel MOS transistors P150 and P151, OR gate G132 provides an H level output. In response, N channel MOS transistor N20 is rendered conductive. Inverter G155 provides an L level output. NAND gate G152 provides an H level output. In response to NAND gate G152 providing an H level output, P channel MOS transistors P150 and P151 are rendered non-conductive.

In response to conduction of N channel MOS transistor N20, one of the potentials of data storage nodes D20 and D21 of latch & amplify circuit LAT20 attains the level of VDD whereas the other attains the level of GND. However, the potentials of data storage nodes D20 and D21 are not provided to global bit line pair HBT, HBTC since P channel MOS transistors P150 and P151 are non-conductive.

At this stage, terminal C of local write drivers DR150 and DR151 receives an H level input. Accordingly, the data of data storage node D20 is driven to local data line DATA, whereas the data of data storage node D21 is driven to local data line DATAC.

Thus, in a read mode, local sense amplifier SA4 equipped with a write function receives the potentials of the local data line pair attaining a partial swing, which are amplified to a full swing by latch & amplify circuit LAT20. The amplified potential is provided to the global bit line pair.

In a write mode, the potentials of the global bit line pair attaining a partial swing are received to be amplified by latch & amplify circuit LAT20 up to the level of a full swing.

According to the SRAM of the sixth embodiment, the potentials of global bit line pair attain a partial swing, not only in a read mode, but also in a write mode. Therefore, power consumption can be reduced. Also, erroneous writing can be prevented.

Seventh Embodiment

The seventh embodiment of the present invention is directed to an SRAM having the processing timing of a local memory circuit set separately from that of the global memory circuit.

In the previous first embodiment, data transfer to a global bit line pair must be completed within an H level period of clock CLK in local sense amplifier SA1<0>. This is because local sense enable signal SE<0> will attain an L level when clock CLK is pulled down to an L level, whereby data storage nodes D20 and D21 of local sense amplifier SA1<0> are precharged.

To have local sense amplifier SA1<0> transfer the data to global bit line pair HBT, HBTC before the precharge operation, the timing of rendering global word line HWD<0> to an active H level must be set during the period where clock CLK attains an H level.

If the clock frequency is increased, the timing of rendering active this global word line HWD<0> must be set earlier. To this end, the delay time of delay circuit DLY that determines the activation timing of global word line HWD<0> must be set shorter. However, a shorter delay time of delay circuit DLY is disadvantageous in that the processes of global sense amplifier HSA and global dummy column HDC cannot be completed. Therefore, the clock frequency could not be increased.

The previous first embodiment was described based on a structure of the two hierarchy levels, including a local memory circuit of the lower level (local sense amplifier, local data line pair, dummy column DC and word line) to read out data from a memory cell, and a global memory circuit of the higher level (global sense amplifier, global bit line pair, global dummy column, and global word line). A structure of three or four hierarchy levels can be implemented. In the case where the number of hierarchy levels is increased, the memory circuit of the higher level will rate-determine the clock frequency. In other words, the clock frequency is determined so as to allow the processing at the memory circuit of the upper level. The seventh embodiment is directed to overcome this problem.

Entire Structure

Figure 21:
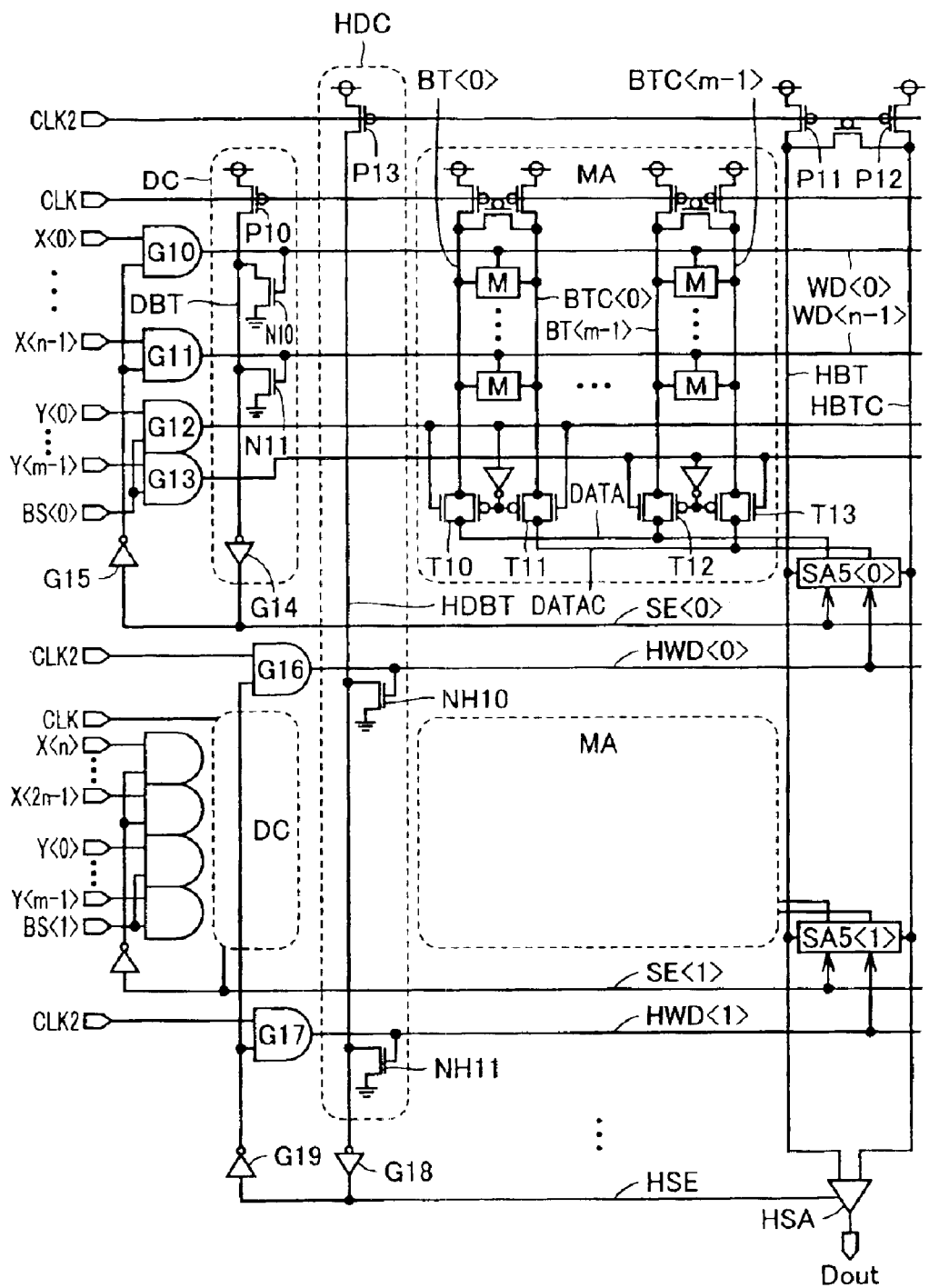
FIG. 21 shows a structure of a main part of an SRAM according to a seventh embodiment of the present invention.

FIG. 21 shows a structure of a main part of an SRAM according to the seventh embodiment. The SRAM of the seventh embodiment differs from the SRAM of the first embodiment shown in FIG. 1 in that an externally applied independent clock CLK2 is applied instead of clock CLK1 that is a delayed version of signal CLK by delay circuit DLY. Clock CLK2 has a frequency identical to that of clock CLK1.

Clock CLK2 is provided to global dummy column HDC, global word drivers G16, G17, and to P channel MOS transistors P11 and P12 for charging global bit line pair HBT, HBTC. The structural elements receiving clock CLK2 effect an operation at the timing of clock CLK2.

The DRAM of the seventh embodiment includes a local sense amplifier SA5 instead of local sense amplifier SA1. The structural element will be described hereinafter.

Local Sense Amplifier SA5

Figure 22:
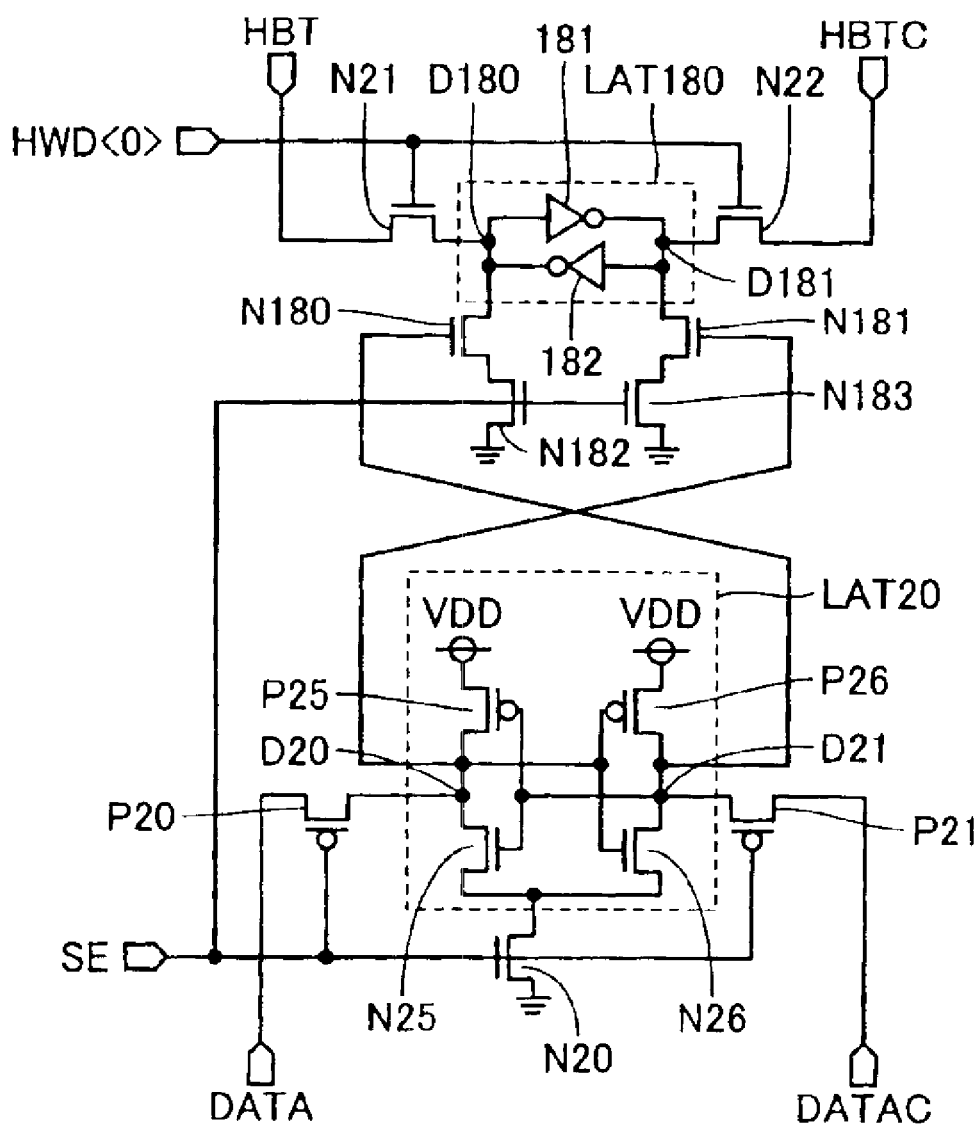
FIG. 22 shows a structure of a local sense amplifier SA5 of the seventh embodiment.

FIG. 22 shows a structure of a local sense amplifier SA5<0> of the present embodiment. Local sense amplifier SA5<0> has a latch circuit LAT180 and N channel MOS transistor N180 and N channel MOS transistors N180–N183 added to local sense amplifier SA1<0> of the first embodiment shown in FIG. 2.

The operation of local sense amplifier SA5<0> in a read mode will be described hereinafter.

Read Operation

The read operation is similar to that of the first embodiment with the exception of the operations of global dummy column HDC and P channel MOS transistors P11 and P12 until the rise of local sense enable signal SE<0>.

In global dummy column HDC, P channel MOS transistor P13 conducts when clock CLK2 is at an L level. Accordingly, global dummy bit line HDBT is set at an H level. This H level potential of global dummy bit line HDBT is inverted by inverter G18. Global sense enable signal HSE is set at an L level.

When clock CLK2 is at an L level, P channel MOS transistors P11 and P12 are rendered conductive. In response, global bit line pair HBT, HBTC is set at an H level.

In local sense amplifier SA5<0>, P channel MOS transistors P20 and P21 are rendered conductive in response to clock CLK. The potential of local data line DATA is transferred to data storage node D20 whereas the potential of local data line DATAC is transferred to data storage node D21.

In response to the rise of local sense enable signal SE<0>, P channel MOS transistors P20 and P21 are rendered non-conductive, whereas N channel MOS transistors N20, N182 and N183 are rendered conductive. In response to non-conduction of P channel MOS transistors P20 and P21, data storage nodes D20 and D21 are isolated from local data lines DATA, DATAC. In response to conduction of N channel MOS transistor N20 the potential of one of data storage nodes D20 and D21 attains the level of VDD whereas the other attains the level of GND.

When the potential of data storage node D20 attains the level of VDD, i.e., an H level, at this stage, N channel MOS transistor N181 is rendered conductive. Accordingly, a data storage node D181 of latch circuit LAT180 is set at an L level whereas a data storage node D180 is set at an H level. Accordingly, the data of local data lines DATA, DATAC are held in latch circuit LAT180. When data is once stored in latch circuit LAT180 the data will not be lost even if clock CLK is pulled down to an L level to cause local sense enable signal SE<0> to go low. Therefore, the rising timing of global word line HWD<0> is not restricted to the H level period of local sense enable signal SE<0>, i.e., when clock CLK attains an H level, as in the first embodiment.

Global word driver G16 responds to clock CLK2 going high to drive global word line HWD<0> to an H level. In response, N channel MOS transistors N21 and N22 are rendered conductive in local sense amplifier SA5<0>. One of global bit lines HBT, HBTC is discharged to the level of GND according to the potentials of data storage nodes D180 and D181.

When global word line HWD<0> attains an H level in global dummy column HDC, N channel MOS transistor NH10 is rendered conductive. Global sense enable signal HSE attains an H level by inverter G18.

The remaining operation is similar to that of the first embodiment.

Thus, according to the SRAM of the seventh embodiment, local sense amplifier SA5 includes a latch circuit LAT180, and the operation of the local memory circuit and the global memory circuit are based on different clock signals. Therefore, the problem of the process in global memory circuit not being completed can be eliminated. Also, it is not necessary to reduce the rate of the clock frequency so as to complete the processing in the global memory circuit.

Clock CLK2 may be set to be opposite in phase with clock CLK. In this case, the local memory circuit can operate during an H level period of clock CLK whereas the global memory circuit can operate during an L level period of clock CLK.

In the case where a structure of at least three hierarchy levels is established, the phase of the clock of each hierarchy level may be set out of phase from that of the clock of the lower hierarchy level. In this case, the data read out from a memory cell can be subjected to a pipeline process sequentially from the memory circuit of the lower hierarchy level. Since one cycle can be allotted to the processing time of the memory circuit of each hierarchy level, the problem of not having the process completed will not occur. By the operation of the memory circuit of each hierarchy level based on a clock directed to each hierarchy level, a structure of three or more hierarchy levels can be readily implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a sense amplifier group configured in a hierarchy to read out data from a memory cell;
   a complementary signal line group for connecting a sense amplifier of a lower hierarchy level of said sense amplifier group with a sense amplifier of a higher hierarchy level of said sense amplifier group and connecting the sense amplifier of the lower hierarchy level of said sense amplifier group with said memory cell; and
   a control circuit suppressing a drive of complementary signal lines of said complementary signal line group by the sense amplifier of lower hierarchy level, and rendering active the sense amplifier of higher hierarchy level before a potential difference between said complementary signal lines reaches a level of power supply voltage;
   wherein, when a sense amplifier of higher hierarchy level of said sense amplifier group is active, said active sense amplifier has no electrical interconnection with the complementary signal lines of said complementary signal line group for connecting said active sense amplifier with the sense amplifier of lower hierarchy level of said sense amplifier group or said memory cell.

2. The semiconductor memory device according to claim 1, further comprising a write driver group configured in a hierarchy to write data into a memory cell, wherein
   a write driver of a lower hierarchy level of said write driver group and a write driver of a higher hierarchy level of said write driver group are connected to each other by said complementary signal lines and a write designation signal line,
   said write driver of higher hierarchy level outputs write data and inverted data thereof to said complementary signal lines and drives the write designation signal line at a predetermined logic value, and
   said write driver of lower hierarchy level is rendered active when a write designation signal output on the write designation line by the write driver of higher hierarchy level attains said predetermined logic value.

3. The semiconductor memory device according to claim 1, further comprising a write driver group configured in a hierarchy to write data into a memory cell, wherein
   a write driver of a lower hierarchy level of said write driver group and a write driver of a higher hierarchy level of said write driver group are connected to each other by said complementary signal lines,
   said write driver of a higher hierarchy level outputs write data to one signal line of said complementary signal lines and drives another signal line of said complementary signal lines at a predetermined potential in a range other than the range of change of said other signal line in a read mode, and
   said write driver of a lower hierarchy level is rendered active when said another signal line attains said predetermined potential.

4. The semiconductor memory device according to claim 3, wherein
   said write driver of a lower hierarchy level comprises a logical element connected to said another signal line,
   said logical element providing an output of a first logic value when the potential of said another signal line is in the range of change in a read mode and provides an output of a second logic value when the potential of said another signal line is in a range other than said range.

5. The semiconductor memory device according to claim 1, wherein a lower hierarchy sense amplifier in said sense amplifier group includes
   a transmission gate provided between complementary signal lines for connecting the lower hierarchy sense amplifier with a sense amplifier of a higher hierarchy level,
   said transmission gate being rendered conductive when in a data write mode.

6. The semiconductor memory device according to claim 1, wherein a predetermined sense amplifier in said sense amplifier group includes a circuit to fetch a potential of complementary signal lines of a higher hierarchy level connected to said predetermined sense amplifier, and an N channel MOS transistor provided between said circuit and complementary signal lines of a lower hierarchy level connected to said predetermined sense amplifier, said N channel MOS transistor being rendered conductive when in a data write mode.

7. The semiconductor memory device according to claim 1, wherein a pair of complementary signal lines of said complementary signal line group are driven at an amplitude smaller than the amplitude of power supply voltage in a data write mode, wherein said sense amplifier of a lower hierarchy level connected to said said pair of complementary signal lines, includes an amplify circuit amplifying potentials of said pair of complementary signal lines, and a P channel MOS transistor provided between said amplify circuit and said pair of complementary signal lines, wherein, in a data write mode, said P channel MOS transistor is rendered conductive to have potentials of said pair of complementary signal lines applied to said amplify circuit, and after said application, said P channel MOS transistor is rendered conductive, and said amplify circuit amplifies said applied potentials at a logic amplitude of power supply voltage, and another pair of complementary signal lines of a lower hierarchy level connected to said sense amplifier of a lower hierarchy level are driven based on said amplified potentials.

8. The semiconductor memory device according to claim 1, wherein said lower hierarchy sense amplifier includes an amplify circuit connected to complementary signal lines connecting to said memory cell, and a latch circuit connected to said amplify circuit and connected to complementary signal lines connecting to the higher hierarchy level sense amplifier, wherein said amplify circuit fetches potentials of said complementary signal lines connecting to said memory cell at a timing based on a first clock to amplify said fetched potentials, and provide said amplified potentials to said latch circuit, wherein said latch circuit drives said complementary signal lines connecting to the higher hierarchy level sense amplifier at latched said amplified potentials at a timing based on a second clock different from said first clock.

9. The semiconductor memory device according to claim 8, wherein said complementary signal lines connecting to the higher hierarchy level sense amplifier are precharged at a timing based on said second clock, and said higher hierarchy level sense amplifier is rendered active at a timing based on said second clock.

* * * * *